(12) United States Patent
Hikosaka et al.

(10) Patent No.: US 11,888,040 B2
(45) Date of Patent: Jan. 30, 2024

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Toshiki Hikosaka, Kawasaki (JP); Hiroshi Ono, Setagaya (JP); Jumpei Tajima, Mitaka (JP); Masahiko Kuraguchi, Yokohama (JP); Shinya Nunoue, Ichikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/987,351

(22) Filed: Nov. 15, 2022

(65) Prior Publication Data

US 2023/0078716 A1 Mar. 16, 2023

Related U.S. Application Data

(63) Continuation of application No. 17/453,389, filed on Nov. 3, 2021, now Pat. No. 11,545,553, which is a
(Continued)

(30) Foreign Application Priority Data

Apr. 15, 2019 (JP) .................................. 2019-076921

(51) Int. Cl.
*H01L 29/423* (2006.01)
*H01L 29/739* (2006.01)
*H01L 29/778* (2006.01)

(52) U.S. Cl.
CPC ...... *H01L 29/4232* (2013.01); *H01L 29/7395* (2013.01); *H01L 29/7787* (2013.01)

(58) Field of Classification Search
CPC ............ H01L 29/4232; H01L 29/7395; H01L 29/7787; H01L 21/02458; H01L 21/0254;
(Continued)

(56) References Cited

U.S. PATENT DOCUMENTS 8,330,167 B2  12/2012  Takehiko et al.
8,981,428 B2   3/2015  Saitoh et al.
(Continued)

FOREIGN PATENT DOCUMENTS

JP  2003-068745 A   3/2003
JP  2010-153837 A   7/2010
(Continued)

*Primary Examiner* — Mohammed R Alam
(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first semiconductor layer, a second semiconductor layer, and a first insulating layer. A position of the third electrode in a first direction is between a position of the first electrode in the first direction and a position of the second electrode in the first direction. The first semiconductor layer includes $Al_{x1}Ga_{1-x1}N$ and includes a first partial region, a second partial region, and a third partial region. The second semiconductor layer includes $Al_{x2}Ga_{1-x2}N$. A portion of the second semiconductor layer is between the third partial region and the third electrode in the second direction. The first insulating layer includes a first insulating region. The first insulating region is between the third electrode and the portion of the second semiconductor layer in the second direction.

9 Claims, 16 Drawing Sheets

Related U.S. Application Data continuation of application No. 16/799,953, filed on Feb. 25, 2020, now Pat. No. 11,211,463.

(58) Field of Classification Search
CPC ........... H01L 21/02579; H01L 21/0262; H01L 21/3245; H01L 29/207; H01L 29/4236; H01L 29/66462; H01L 29/7788; H01L 29/7789; H01L 29/2003; H01L 29/7786

See application file for complete search history.

(56) References Cited

U.S. PATENT DOCUMENTS

| | | | |
|---|---|---|---|
| 2002/0187568 A1 | 12/2002 | Stockman | |
| 2006/0220044 A1* | 10/2006 | Sugawara | ......... H01L 21/02389 |
| | | | 257/E29.093 |
| 2013/0099245 A1 | 4/2013 | Ando et al. | |
| 2013/0181226 A1* | 7/2013 | Saitoh | ............... H01L 29/66431 |
| | | | 438/172 |
| 2013/0309828 A1 | 11/2013 | Kambayashi et al. | |
| 2015/0263220 A1 | 9/2015 | Yamane | |
| 2016/0225857 A1 | 8/2016 | Saito et al. | |

FOREIGN PATENT DOCUMENTS

| | | |
|---|---|---|
| JP | 2011-210785 A | 10/2011 |
| JP | 2012-094688 A | 5/2012 |
| JP | 2012-156269 A | 8/2012 |
| JP | 2014-107409 A | 6/2014 |
| JP | 2016-143842 A | 8/2016 |
| WO | WO 2011/118099 A1 | 9/2011 |

* cited by examiner

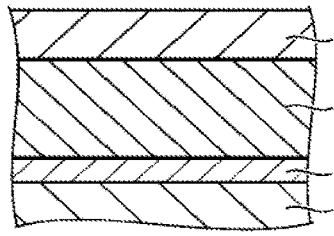 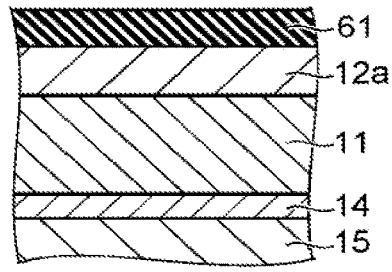 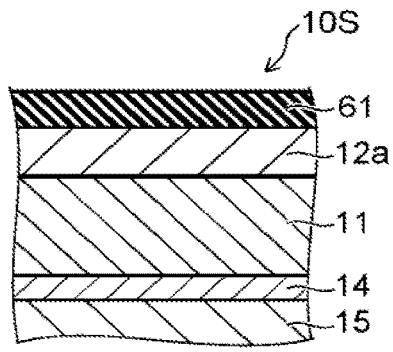
FIG. 8A          FIG. 8B          FIG. 8C
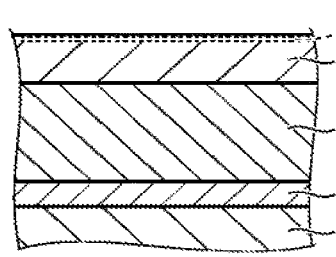 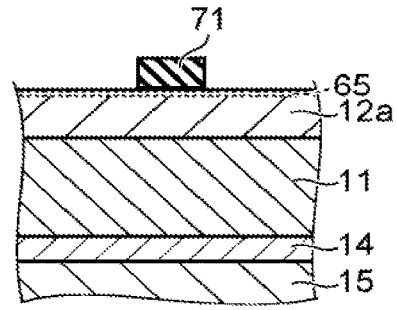 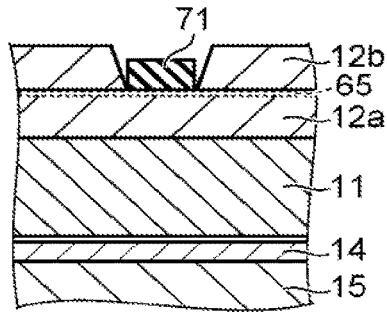
FIG. 8D          FIG. 8E          FIG. 8F
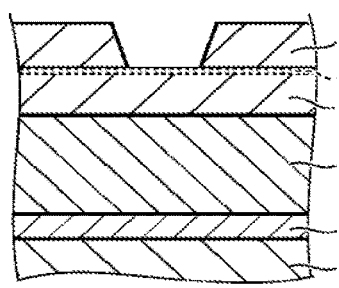 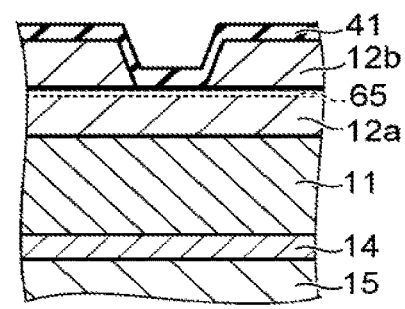 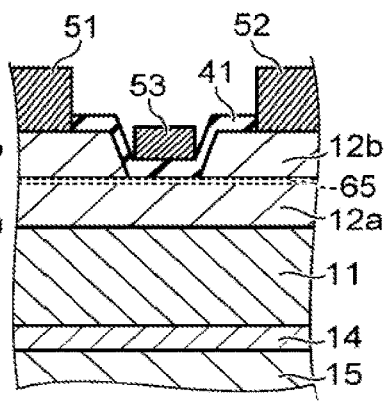
FIG. 8G          FIG. 8H          FIG. 8I

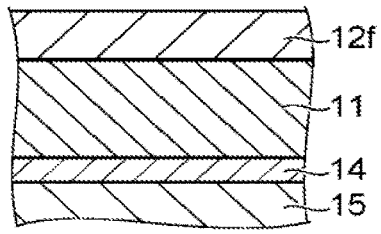 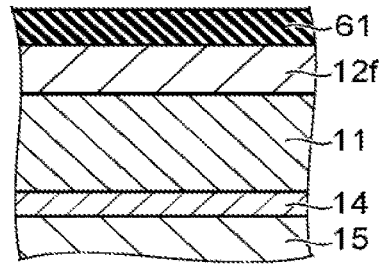 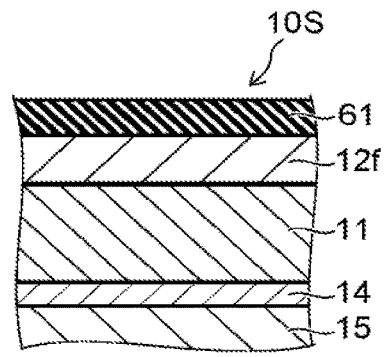
FIG. 13A     FIG. 13B     FIG. 13C
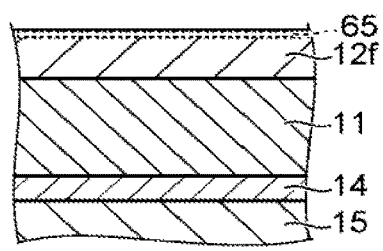 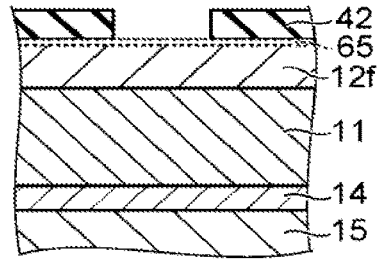 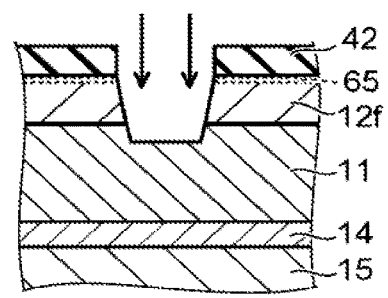
FIG. 13D     FIG. 13E     FIG. 13F
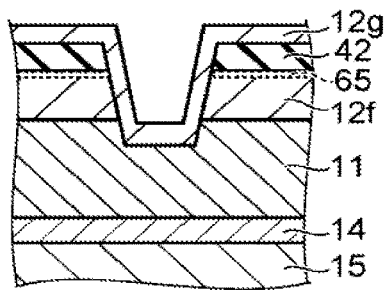 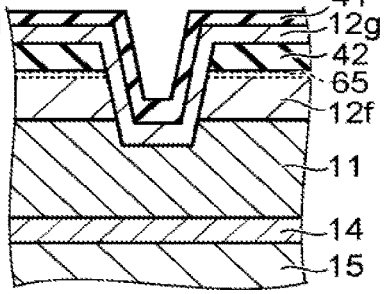 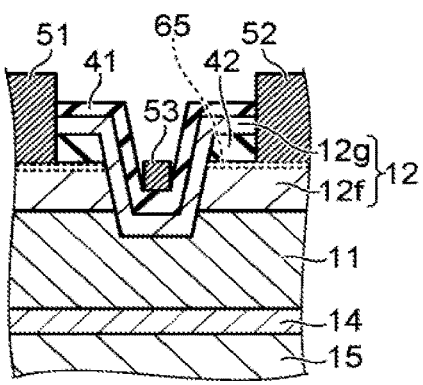
FIG. 13G     FIG. 13H     FIG. 13I

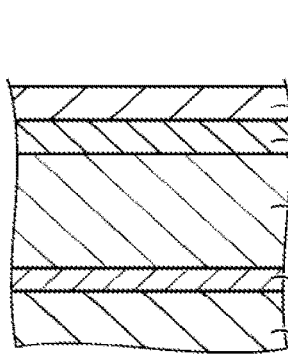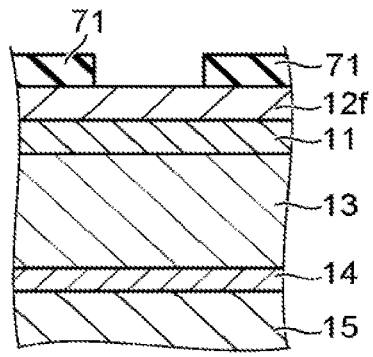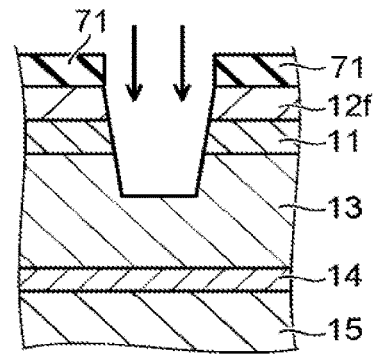
FIG. 17A    FIG. 17B    FIG. 17C
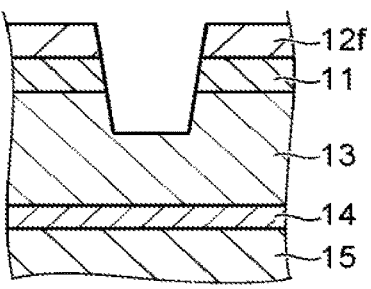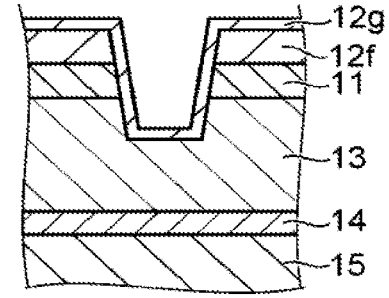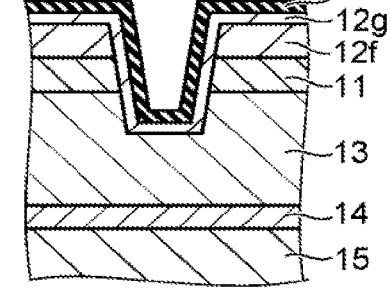
FIG. 17D    FIG. 17E    FIG. 17F
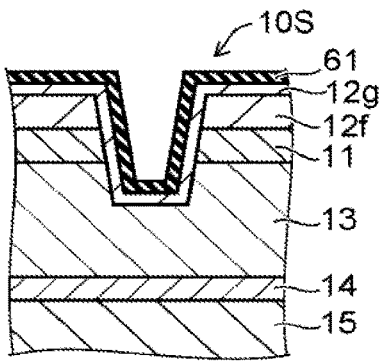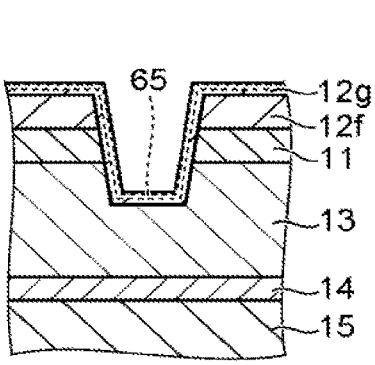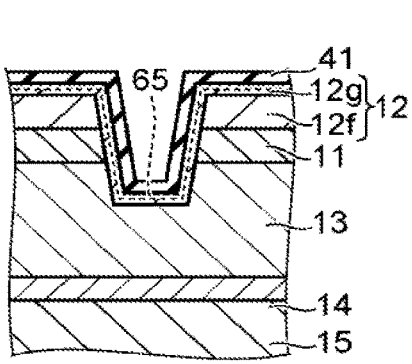
FIG. 17G    FIG. 17H    FIG. 17I
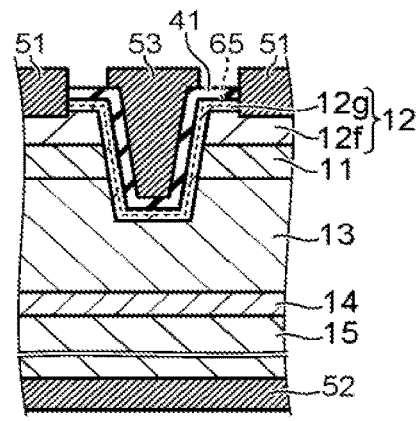
FIG. 17J

SEMICONDUCTOR DEVICE AND METHOD FOR MANUFACTURING THE SAME

CROSS-REFERENCE TO RELATED APPLICATIONS

This application is a continuation of U.S. application Ser. No. 17/453,389, filed on Nov. 3, 2021, which is a continuation of U.S. application Ser. No. 16/799,953, filed on Feb. 25, 2020, which is based upon and claims the benefit of priority from Japanese Patent Application No. 2019-076921, filed on Apr. 15, 2019; the entire contents of which are incorporated herein by reference.

FIELD

Embodiments described herein relate generally to a semiconductor device and a method for manufacturing the same.

BACKGROUND

For example, there is a semiconductor device such as a transistor or the like that uses a nitride semiconductor. It is desirable to improve the characteristics of the semiconductor device.

BRIEF DESCRIPTION OF THE DRAWINGS

FIG. 8A to FIG. 8I are schematic cross-sectional views illustrating a method for manufacturing a semiconductor device according to the second embodiment;

FIG. 13A to FIG. 13I are schematic cross-sectional views illustrating a method for manufacturing a semiconductor device according to the second embodiment;

FIG. 17A to FIG. 17J are schematic cross-sectional views illustrating a method for manufacturing a semiconductor device according to a fourth embodiment.

DETAILED DESCRIPTION

Figure 1A:
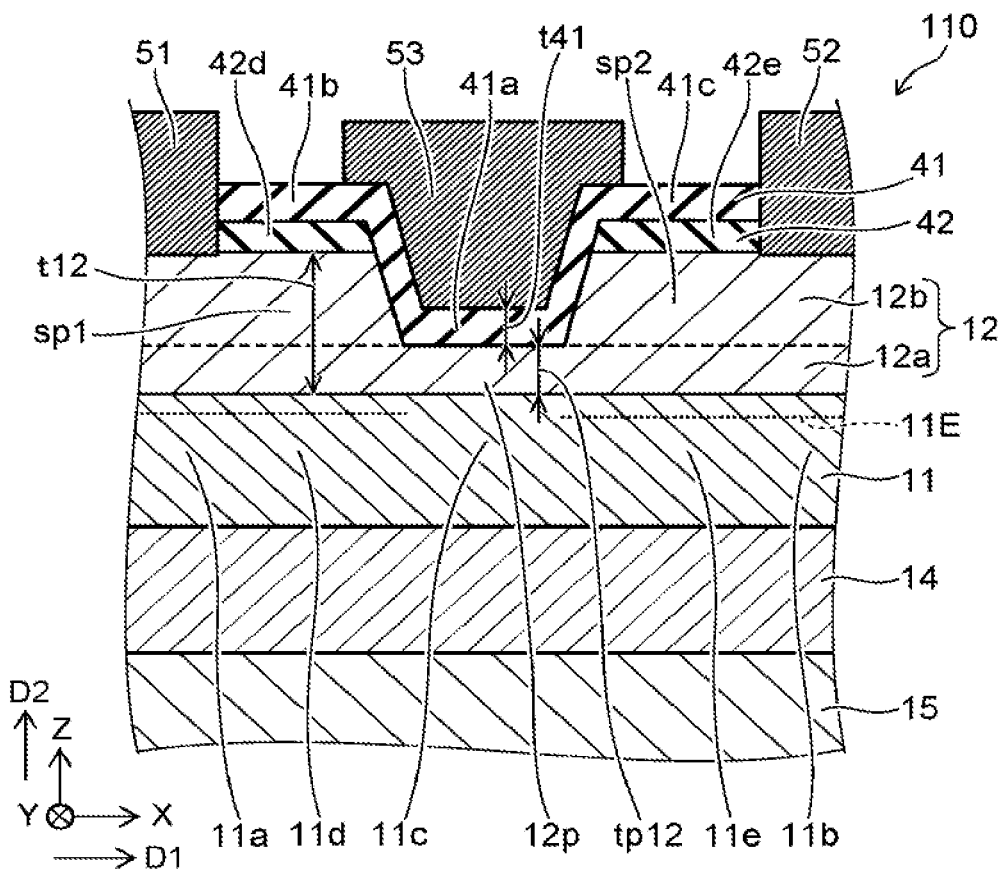
FIG. 1A and FIG. 1B are schematic views illustrating a semiconductor device according to a first embodiment.

According to one embodiment, a semiconductor device includes a first electrode, a second electrode, a third electrode, a first semiconductor layer, a second semiconductor layer, and a first insulating layer. A position of the third electrode in a first direction is between a position of the first electrode in the first direction and a position of the second electrode in the first direction. The first direction is from the first electrode toward the second electrode. The first semiconductor layer includes $Al_{x1}Ga_{1-x1}N$ ($0 \le x1 < 1$) and includes a first partial region, a second partial region, and a third partial region. A second direction from the first partial region toward the first electrode crosses the first direction. A direction from the second partial region toward the second electrode is aligned with the second direction. A direction from the third partial region toward the third electrode is aligned with the second direction. The second semiconductor layer includes $Al_{x2}Ga_{1-x2}N$ ($0 < x2 \le 1$ and $x1 < x2$). A portion of the second semiconductor layer is between the third partial region and the third electrode in the second direction. The first insulating layer includes a first insulating region. The first insulating region is between the third electrode and the portion of the second semiconductor layer in the second direction. A concentration of hydrogen in the third partial region is less than $1/10$ of a concentration of magnesium in the third partial region.

According to another embodiment, a semiconductor device includes a first electrode, a second electrode, a third electrode, a first semiconductor layer, a second semiconductor layer, and a first insulating layer. A first direction from the third electrode toward the first electrode crosses a second direction from the second electrode toward the third electrode. The first semiconductor layer includes $Al_{x1}Ga_{1-x1}N$ ($0 \le x1 < 1$). A direction from the third electrode toward the first semiconductor layer is aligned with the first direction. A direction from the first semiconductor layer toward the first electrode is aligned with the second direction. The second semiconductor layer includes $Al_{x2}Ga_{1-x2}N$ ($0 < x2 \le 1$ and $x1 < x2$) and includes a first semiconductor region. The first semiconductor region is between the third electrode and the first semiconductor layer in the first direction. The first insulating layer includes a first insulating region. The first insulating region is between the third electrode and the first semiconductor region in the first direction. A concentration of hydrogen in the first semiconductor layer is less than $1/10$ of a concentration of magnesium in the first semiconductor layer.

According to another embodiment, a method for manufacturing a semiconductor device is disclosed. The method can include preparing a structure body. The structure body includes a first semiconductor layer, a second semiconductor layer, and a first layer. The first semiconductor layer includes $Al_{x1}Ga_{1-x1}N$ ($0 \le x1 < 1$) and includes magnesium and hydrogen. The second semiconductor layer includes $Al_{x2}Ga_{1-x2}N$ ($0 < x2 \le 1$ and $x1 < x2$). The second semiconductor layer is between the first semiconductor layer and the first layer. The method can include performing heat treatment of the structure body.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
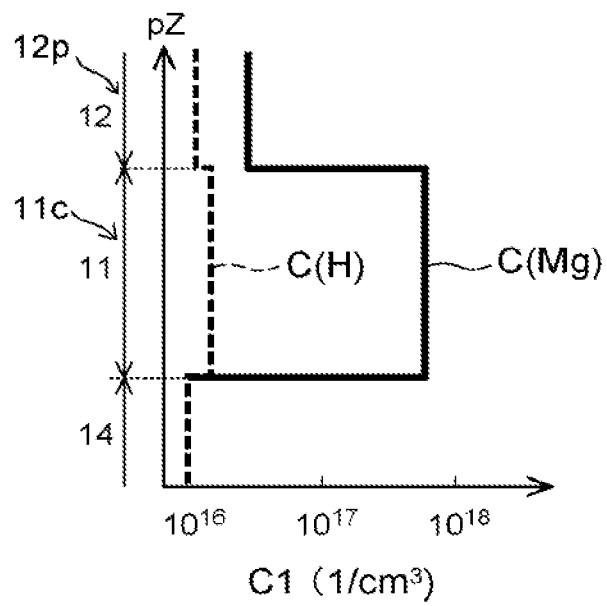

FIG. 1A and FIG. 1B are schematic views illustrating a semiconductor device according to a first embodiment.

FIG. 1A is a cross-sectional view. FIG. 1B is a graph.

As shown in FIG. 1A, the semiconductor device 110 according to the embodiment includes a first electrode 51, a second electrode 52, a third electrode 53, a first semiconductor layer 11, a second semiconductor layer 12, and a first insulating layer 41.

The direction from the first electrode 51 toward the second electrode 52 is taken as a first direction D1. The first direction D1 is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction D1 (the X-axis direction) is between the position of the first electrode 51 in the first direction D1 and the position of the second electrode 52 in the first direction D1. For example, at least a portion of the third electrode 53 in the X-axis direction is between the first electrode 51 and the second electrode 52.

The first semiconductor layer 11 includes $Al_{x1}Ga_{1-x1}N$ ($0 \leq x1 < 1$). In one example, the first semiconductor layer 11 includes GaN. For example, the first semiconductor layer 11 is substantially parallel to the X-Y plane.

The first semiconductor layer 11 includes a first partial region 11a, a second partial region 11b, and a third partial region 11c. The direction from the first partial region 11a toward the first electrode 51 is taken as a second direction D2. The second direction D2 crosses the first direction D1. The second direction D2 is, for example, the Z-axis direction. The direction from the second partial region 11b toward the second electrode 52 is aligned with the second direction D2. The direction from the third partial region 11c toward the third electrode 53 is aligned with the second direction D2.

For example, the first partial region 11a is below the first electrode 51. For example, the second partial region 11b is below the second electrode 52. For example, the third partial region 11c is below the third electrode 53.

The first semiconductor layer 11 may further include a fourth partial region 11d and a fifth partial region 11e. The fourth partial region 11d is between the first partial region 11a and the third partial region 11c in the first direction D1 (the X-axis direction). The fifth partial region 11e is between the third partial region 11c and the second partial region 11b in the first direction D1.

The first to fifth partial regions 11a to 11e of the first semiconductor layer 11 are continuous with each other.

The position of the fourth partial region 11d in the first direction D1 (the X-axis direction) is between the position of the first electrode 51 in the first direction D1 and the position of the third electrode 53 in the first direction D1. The position of the fifth partial region 11e in the first direction D1 (the X-axis direction) is between the position of the third electrode 53 in the first direction D1 and the position of the second electrode 52 in the first direction D1.

The second semiconductor layer 12 includes $Al_{x2}Ga_{1-x2}N$ ($0 < x2 \leq 1$ and $x1 < x2$). The second semiconductor layer 12 includes, for example, AlGaN (e.g., $Al_{0.25}Ga_{0.75}N$). In the example, a portion 12p of the second semiconductor layer 12 is between the third partial region 11c and the third electrode 53 in the second direction D2 (the Z-axis direction).

As shown in FIG. 1A, the second semiconductor layer 12 may include a first portion 12a and a second portion 12b. The first portion 12a is between the second portion 12b and the first semiconductor layer 11 in the Z-axis direction. The composition of the first portion 12a may be the same as or different from the composition of the second portion 12b. The boundary between the first portion 12a and the second portion 12b may be indistinct. The composition ratio of Al in the first portion 12a may be different from the composition ratio of Al in the second portion 12b. Hereinbelow, the case is described where the composition ratios of the first portion 12a and the second portion 12b are the same, and the first portion 12a and the second portion 12b include $Al_{x2}Ga_{1-x2}N$ ($0 < x2 \leq 1$ and $x1 < x2$).

In addition to the portion 12p recited above, the second semiconductor layer 12 includes a first semiconductor region sp1 and a second semiconductor region sp2. The direction from the fourth partial region 11d toward the first semiconductor region sp1 is aligned with the second direction D2 (the Z-axis direction). The direction from the fifth partial region 11e toward the second semiconductor region sp2 is aligned with the second direction D2.

The position of the first semiconductor region sp1 in the first direction D1 (the X-axis direction) is between the position of the first electrode 51 in the first direction D1 and the position of the third electrode 53 in the first direction D1. The position of the second semiconductor region sp2 in the first direction D1 (the X-axis direction) is between the position of the third electrode 53 in the first direction D1 and the position of the second electrode 52 in the first direction D1.

The first electrode 51 is electrically connected to the first semiconductor region sp1. The second electrode 52 is electrically connected to the second semiconductor region sp2.

The first insulating layer 41 includes a first insulating region 41a. The first insulating region 41a is between the third electrode 53 and the portion 12p of the second semiconductor layer 12 recited above in the second direction D2 (the Z-axis direction).

In the example, the first insulating layer 41 further includes a second insulating region 41b and a third insulating region 41c. The second insulating region 41b and the third insulating region 41c are continuous with the first insulating region 41a.

In the example, the semiconductor device 110 further includes a second insulating layer 42. The second insulating layer 42 includes, for example, a fourth insulating region 42d and a fifth insulating region 42e. The fourth insulating region 42d is between the first semiconductor region sp1 and the second insulating region 41b in the second direction D2 (the Z-axis direction). The fifth insulating region 42e is between the second semiconductor region sp2 and the third insulating region 41c in the second direction D2 (the Z-axis direction).

The first insulating layer 41 includes, for example, silicon and oxygen. The second insulating layer 42 includes, for example, silicon and nitrogen. The concentration of nitrogen in the second insulating layer 42 is higher than the concentration of nitrogen in the first insulating layer 41. The concentration of oxygen in the first insulating layer 41 is higher than the concentration of oxygen in the second insulating layer 42. The first insulating layer 41 includes, for example, silicon oxide (e.g., $SiO_2$). The second insulating layer 42 includes, for example, silicon nitride (SiN).

For example, the second insulating layer 42 functions as a protective layer of the semiconductor layer. A portion of the first insulating layer 41 functions as an upper protective layer.

In the example, the semiconductor device 110 further includes a substrate 15 and an intermediate layer 14. The first semiconductor layer 11 is between the substrate 15 and the second semiconductor layer 12. The intermediate layer 14 is between the substrate 15 and the first semiconductor layer 11. The intermediate layer 14 may include, for example, a buffer layer. The buffer layer includes, for example, a nitride film including Al. Multiple stacked nitride films may be provided in the buffer layer. The intermediate layer 14 may further include, for example, an i-GaN layer. The impurity concentration in the i-GaN layer is lower than the impurity concentration in the first semiconductor layer 11. The impurity concentration includes, for example, the concentration of Mg or Si, etc. The buffer layer is provided between the substrate 15 and the i-GaN layer.

In the semiconductor device 110, a carrier region 11E is formed in a portion of the first semiconductor layer 11 proximal to the second semiconductor layer 12. The carrier region 11E is, for example, a two-dimensional electron gas.

For example, the first electrode 51 functions as a source electrode. For example, the second electrode 52 functions as a drain electrode. For example, the third electrode 53 functions as a gate electrode. For example, the first insulating region 41a functions as a gate insulating film. A current that flows between the first electrode 51 and the second electrode 52 can be controlled by controlling the potential of the third electrode 53.

The semiconductor device 110 is, for example, a HEMT (High Electron Mobility Transistor).

In the example, for example, the direction from a portion of the third electrode 53 toward the second semiconductor layer 12 is aligned with the first direction D1 (the X-axis direction). A thickness tp12 of the portion 12p of the second semiconductor layer 12 recited above is thinner than a thickness t12 of the first semiconductor region sp1. The thickness tp12 of the portion 12p of the second semiconductor layer 12 recited above is thinner than the thickness of the second semiconductor region sp2. These thicknesses are distances along the second direction D2 (the Z-axis direction). Because the thickness tp12 is thin, the carrier region 11E below the third electrode 53 disappears easily. The threshold voltage can be high thereby. For example, a normally-off characteristic is obtained.

In the embodiment, the third partial region 11c includes magnesium (Mg). The Mg functions as a p-type impurity. For example, the third partial region 11c functions as a p-type semiconductor. Because the third partial region 11c functions as a p-type semiconductor, the carrier region 11E in the third partial region 11c locally disappears more easily. The threshold voltage stably can be high thereby. For example, a normally-off characteristic is obtained stably.

In the embodiment, the concentration of hydrogen in the third partial region 11c is less than 1/10 of the concentration of magnesium in the third partial region 11c. Thereby, the threshold voltage stably can be high; and a normally-off characteristic is obtained easily. According to the embodiment, a semiconductor device can be provided in which the characteristics can be improved. The concentration of hydrogen in the third partial region 11c may be not more than 1/100 of the concentration of magnesium in the third partial region 11c.

FIG. 1B schematically shows the concentration of hydrogen and the concentration of Mg in the semiconductor device 110. The horizontal axis is a concentration C1 (1/cm³) of these elements. The vertical axis is a position pZ in the Z-axis direction. FIG. 1B illustrates a concentration C(H) of hydrogen and a concentration C(Mg) of Mg in the intermediate layer 14 (e.g., a portion of an i-GaN layer), the first semiconductor layer 11, and the second semiconductor layer 12.

As shown in FIG. 1B, the concentration of hydrogen in the third partial region 11c is less than 1/10 of the concentration of magnesium in the third partial region 11c. For example, the third partial region 11c substantially may not include hydrogen. For example, the concentration of hydrogen in the third partial region 11c is less than 1/10 of the concentration of magnesium in the third partial region 11c, and may be not less than 1/1000 of the concentration of magnesium in the third partial region 11c.

Thus, the concentration of hydrogen in the third partial region 11c is markedly low compared to the concentration of magnesium in the third partial region 11c. In a nitride semiconductor such as GaN, etc., hydrogen cancels the function of the p-type impurity. For example, in a nitride semiconductor, hydrogen functions as an n-type impurity.

A source gas and a carrier gas are used when growing a p-type nitride semiconductor (e.g., GaN). The source gas includes a compound including Mg, a compound including Ga, and a compound including nitrogen. For example, the compound that includes Mg is bis cyclopentadienyl magnesium ($Cp_2Mg$), etc. For example, the compound that includes Ga is trimethylgallium (TMG), etc. For example, the compound that includes nitrogen is ammonia, etc. The carrier gas is, for example, hydrogen.

After growing the p-type nitride semiconductor (e.g., GaN) by using such a source gas and such a carrier gas, heat treatment is performed to activate. It is considered that the hydrogen is removed and the Mg is activated thereby. The p-type nitride semiconductor is obtained from the nitride semiconductor including activated Mg.

Here, it was found that it is difficult to obtain the target p-type nitride semiconductor (e.g., p-type GaN) when the heat treatment for activation is performed in a state in which a nitride semiconductor (e.g., AlGaN) including Al is provided on the nitride semiconductor (e.g., GaN) including Mg. It was found that the hydrogen is substantially not removed even when the heat treatment is performed in a state in which the AlGaN layer is provided on the GaN layer including Mg. For example, the cause may be affected by the carrier region 11E generated when providing the AlGaN on the GaN.

Therefore, it is difficult to obtain the p-type GaN layer even when the heat treatment is performed in the state in which the AlGaN layer is provided on the GaN layer including Mg.

The inventor of the application discovered that in the case where the AlGaN layer is provided on the GaN layer including Mg, the concentration of hydrogen is reduced by the heat treatment by further providing another layer on the AlGaN layer. It was found that the concentration of hydrogen can be sufficiently low compared to the concentration of Mg, and the p-type semiconductor layer is obtained thereby.

An experiment performed by the inventor of the application will now be described. The samples of the experiment were made based on the manufacturing method described below.

FIG. 2A to FIG. 2F are schematic cross-sectional views illustrating the method for manufacturing the semiconductor device according to the first embodiment.

Figure 2A:
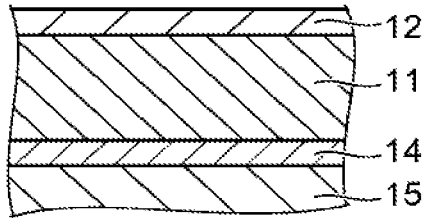
FIG. 2A to FIG. 2F are schematic cross-sectional views illustrating the method for manufacturing the semiconductor device according to the first embodiment.

As shown in FIG. 2A, the intermediate layer 14 is formed on the substrate 15; the first semiconductor layer 11 is formed on the intermediate layer 14; and the second semiconductor layer 12 is formed on the first semiconductor layer 11. For example, these layers are formed using epitaxial growth. The first semiconductor layer 11 includes $Al_{x1}Ga_{1-x1}N$ ($0 \le x1 < 1$) and includes magnesium and hydrogen. The second semiconductor layer 12 includes $Al_{x2}Ga_{1-x2}N$ ($0 < x2 \le 1$ and $x1 < x2$).

Figure 2B:
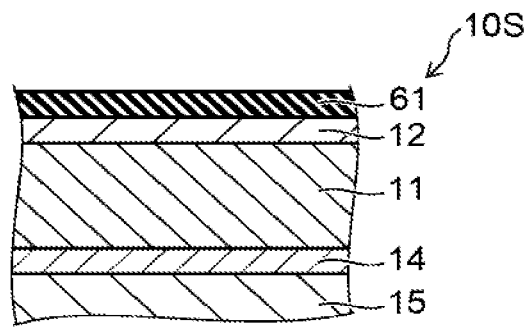

As shown in FIG. 2B, a first layer 61 is formed on the second semiconductor layer 12. A structure body 10S is obtained thereby. The structure body 10S includes the first semiconductor layer 11, the second semiconductor layer 12, and the first layer 61. The second semiconductor layer 12 is between the first semiconductor layer 11 and the first layer 61. The first layer 61 includes, for example, SiN, etc.

Figure 2C:
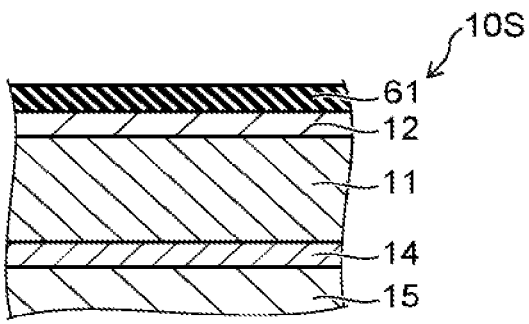

As shown in FIG. 2C, heat treatment (a first heat treatment) of the structure body 10S is performed. In the experiment, for example, the first heat treatment is performed in an atmosphere including nitrogen. The temperature of the first heat treatment is, for example, 750° C. The time of the first heat treatment is, for example, 10 minutes.

Figure 2D:
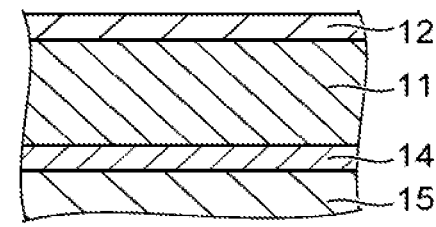
Figure 2E:
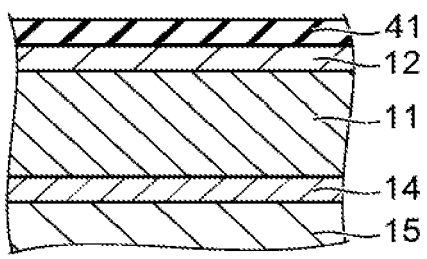
Figure 2F:
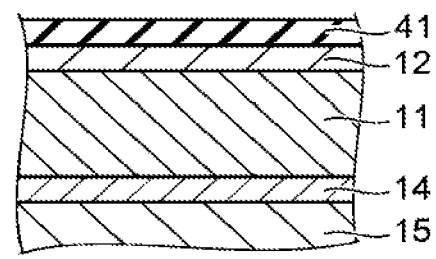

As shown in FIG. 2D, the first layer 61 is removed as necessary. The first insulating layer 41 is formed as shown in FIG. 2E. As shown in FIG. 2F, another heat treatment (a second heat treatment) is performed. The first insulating layer 41 is stabilized by the second heat treatment. Subsequently, the first to third electrodes 51 to 53 are formed. The semiconductor device 110 is obtained thereby. The second insulating layer 42 may be formed as necessary in the method recited above.

In the experiment, element analysis is performed for first to fourth samples SP1 to SP4 recited below. The first sample SP1 is a sample before forming the first layer 61 recited above. Also, the first heat treatment is not performed for the first sample SP1. For the second sample SP2, the first heat treatment recited above is performed without forming the first layer 61 recited above. For the third sample SP3, a SiN layer (having a thickness of 20 nm) is formed as the first layer 61; and the first heat treatment recited above is performed. For the fourth sample SP4, a $SiO_2$ layer (having a thickness of 20 nm) is formed as the first layer 61; and the first heat treatment recited above is performed.

Figure 3A:
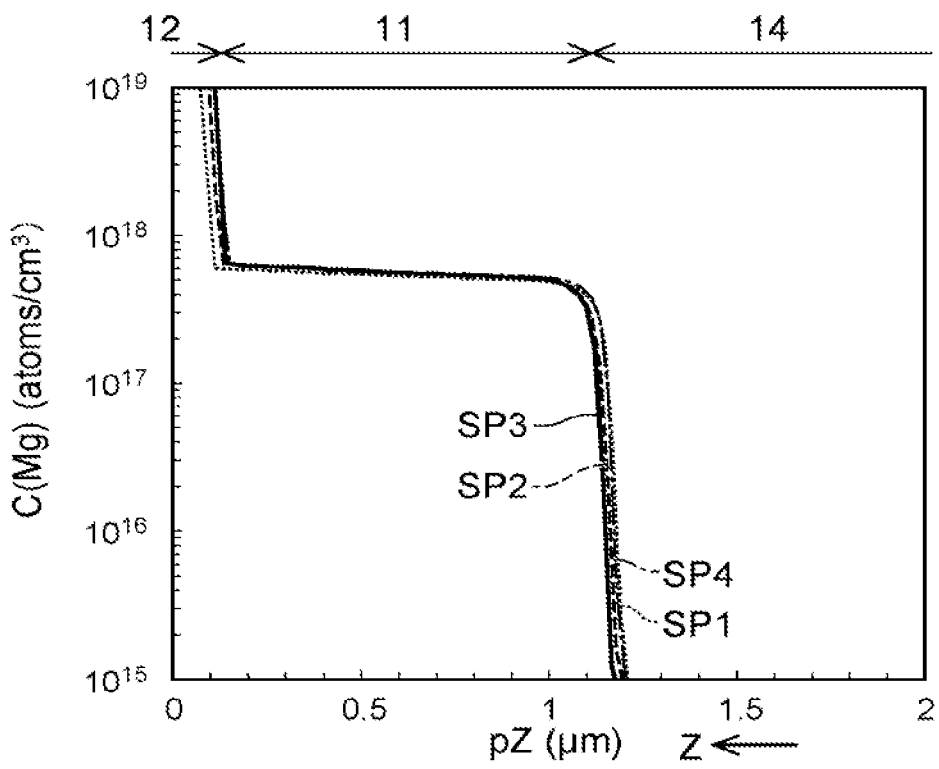
FIG. 3A and FIG. 3B are graphs illustrating the experiment results.
Figure 3B:
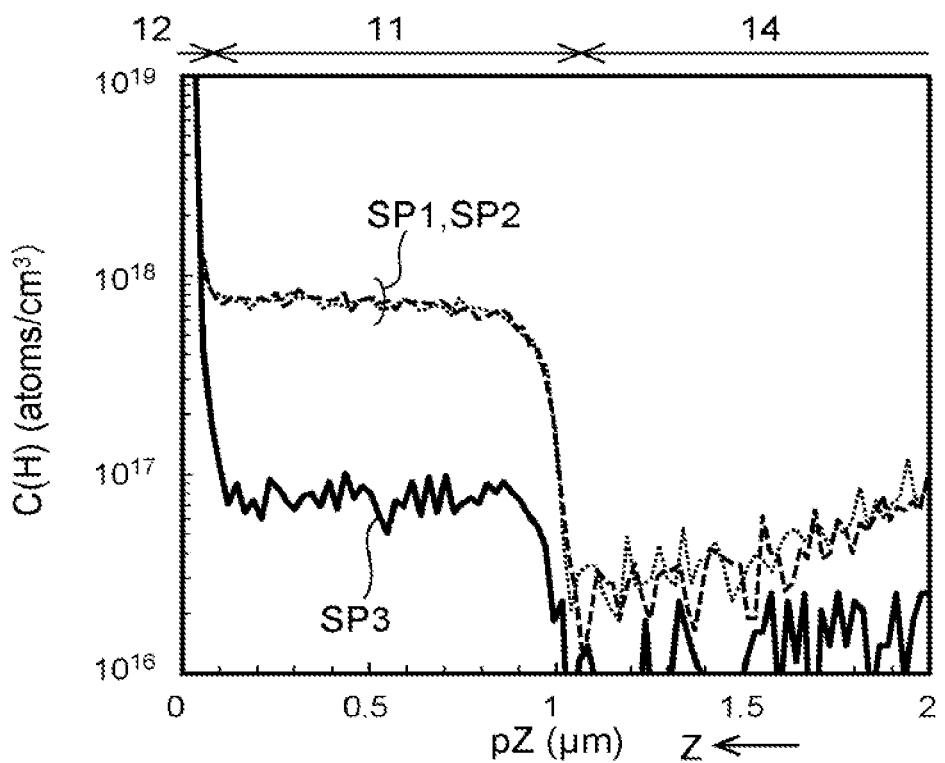
Figure 4:
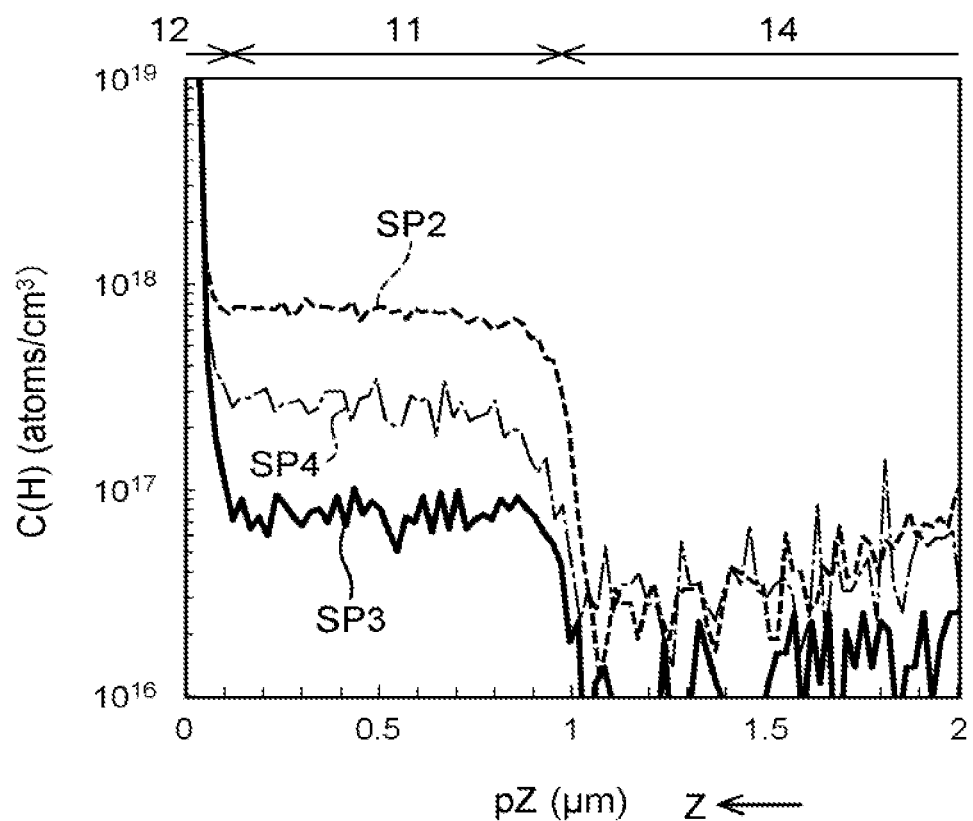
FIG. 4 is a graph illustrating the experiment results.

FIG. 3A, FIG. 3B, and FIG. 4 are graphs illustrating the experiment results.

These figures illustrate SIMS (Secondary Ion Mass Spectrometry) results of the samples recited above. In these figures, the horizontal axis is the position pZ (μm) in the Z-axis direction. The vertical axis of FIG. 3A is the concentration C(Mg) (atoms/cm$^3$) of Mg. In FIG. 3B and FIG. 4, the vertical axis is the concentration C(H) (atoms/cm$^3$) of hydrogen. In the example, the detection lower limit (the minimum value) of Mg is $2 \times 10^{14}$ (1/cm$^3$). In the example, the detection lower limit (the minimum value) of hydrogen is $2 \times 10^{16}$ (1/cm$^3$).

As shown in FIG. 3A, the concentration C(Mg) of Mg is substantially the same for the first to fourth samples SP1 to SP4. The concentration C(Mg) of Mg substantially does not change regardless of the existence or absence of the first layer 61 and the existence or absence of the first heat treatment.

As shown in FIG. 3B, the concentration C(H) of hydrogen in the first semiconductor layer 11 is high for the first sample SP1 and the second sample SP2. The concentration C(H) of hydrogen in the first semiconductor layer 11 is low for the third sample SP3. Therefore, it is considered that the hydrogen in the first semiconductor layer 11 is removed effectively by providing the first layer 61 (e.g., the SiN layer) and by performing the first heat treatment.

As shown in FIG. 4, the concentration C(H) of hydrogen in the first semiconductor layer 11 for the fourth sample SP4 is lower than for the first sample SP1 (and the second sample SP2). Therefore, it is considered that the hydrogen in the first semiconductor layer 11 is removed effectively by providing the first layer 61 (e.g., the $SiO_2$ layer) and by performing the first heat treatment.

Generally, it cannot be predicted that the concentration of hydrogen would be reduced by providing the first layer 61 on the second semiconductor layer 12. Ordinarily, it is considered that the first layer 61 functions as a capping layer. By ordinary considerations, it is estimated that the first layer 61 suppresses the movement (the diffusion) to the external environment of the hydrogen in the first semiconductor layer 11.

However, as in the experiment results recited above, the concentration of hydrogen in the first semiconductor layer 11 below the first layer 61 is reduced by providing the first layer 61. Such a decrease is a phenomenon first discovered by the inventor of the application. For example, it is considered that the reduction of the concentration of hydrogen in the first semiconductor layer 11 by providing the first layer 61 is perhaps caused by the first layer 61 acting on the carrier region 11E in the first heat treatment. It is considered that in the first heat treatment in which the first layer 61 is provided, for example, the effects of the carrier region 11E are small; and the hydrogen in the first semiconductor layer 11 is removed easily by the heat treatment.

As shown in FIG. 4, the concentration C(H) of hydrogen in the first semiconductor layer 11 in the third sample SP3 is lower than the concentration C(H) of hydrogen in the first semiconductor layer 11 in the fourth sample SP4. Therefore, it is more favorable to use SiN as the first layer 61. The concentration C(H) of hydrogen in the first semiconductor layer 11 can be reduced thereby.

Thus, the concentration of hydrogen in the first semiconductor layer 11 is reduced by performing the first heat treatment in the state in which the first layer 61 is provided. The Mg in the first semiconductor layer 11 is activated by performing the first heat treatment.

Thereby, the first semiconductor layer 11 can function effectively as a p-type semiconductor. Thereby, the threshold voltage stably can be high; and a normally-off characteristic is obtained stably. According to the embodiment, a semiconductor device can be provided in which the characteristics can be improved.

In FIG. 3A, FIG. 3B, and FIG. 4, the first semiconductor layer 11 may be considered to be the third partial region 11c. As shown in FIG. 3A, the concentration C(Mg) of Mg in the first semiconductor layer 11 (e.g., the third partial region 11c) is, for example, less than $1 \times 10^{18}$/cm$^3$. The concentration C(Mg) of Mg in the first semiconductor layer 11 (e.g., the third partial region 11c) is, for example, less than $8 \times 10^{17}$/cm$^3$.

As shown in FIG. 3A, the concentration C(Mg) of Mg in the first semiconductor layer 11 (e.g., the third partial region 11c) is, for example, greater than $1\times10^{15}/cm^3$. The concentration C(Mg) of Mg in the first semiconductor layer 11 (e.g., the third partial region 11c) is, for example, greater than $1\times10^{15}/cm^3$.

In one example as shown in FIG. 3B, the concentration C(H) of hydrogen in the first semiconductor layer 11 (e.g., the third partial region 11c) is less than $1\times10^{17}/cm^3$. The concentration C(H) of hydrogen in the first semiconductor layer 11 (e.g., the third partial region 11c) may be, for example, less than $8\times10^{16}/cm^3$.

As shown in FIG. 3B, the concentration C(H) of hydrogen in the first semiconductor layer 11 (e.g., the third partial region 11c) is greater than $1\times10^{14}/cm^3$.

As shown in FIG. 3B, for example, the concentration C(H) of hydrogen in the intermediate layer 14 is lower than the concentration C(H) of hydrogen in the first semiconductor layer 11 (e.g., the third partial region 11c).

Figure 5A:
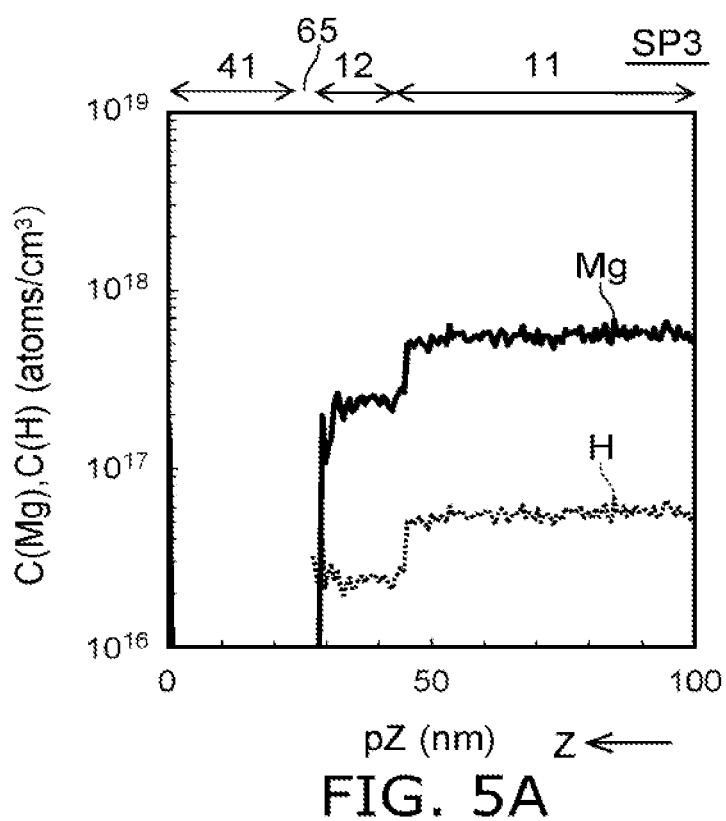
FIG. 5A and FIG. 5B are graphs illustrating the semiconductor device according to the embodiment.
Figure 5B:
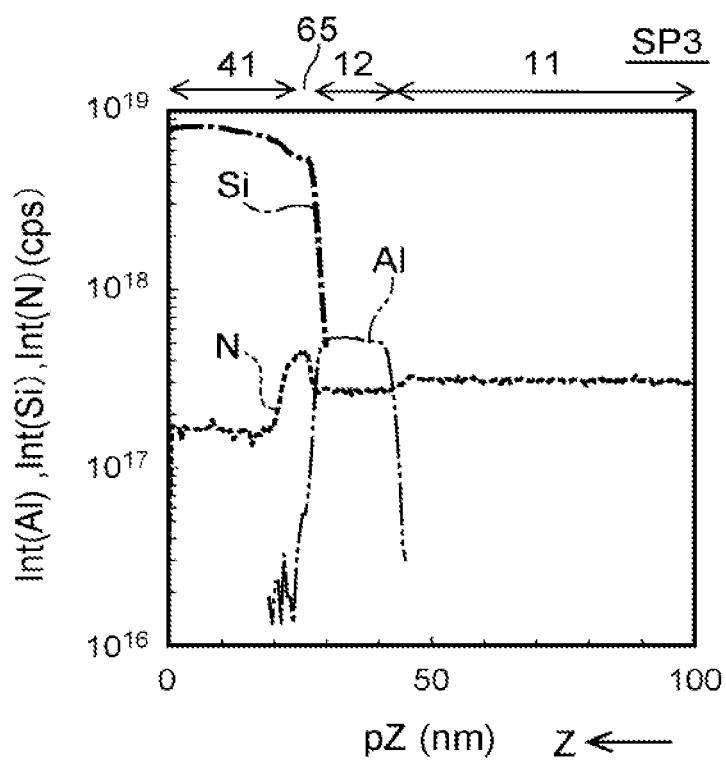

FIG. 5A and FIG. 5B are graphs illustrating the semiconductor device according to the embodiment. These figures illustrate SIMS results of the third sample SP3. In these figures, the horizontal axis is the position pZ (nm) in the Z-axis direction. The vertical axis of FIG. 3A is the concentration C(Mg) (atoms/cm³) of Mg or the concentration C(H) (atoms/cm³) of hydrogen. The vertical axis of FIG. 5B is the detection intensity Int(Al) (cps) of Al, the detection intensity Int(Si) (cps) of Si, or the detection intensity Int(N) (cps) of nitrogen (N). The detection intensity Int(Al) of Al, the detection intensity Int(Si) of Si, and the detection intensity Int(N) of nitrogen are secondary ion intensities. In these figures, the first semiconductor layer 11 may be considered to be the third partial region 11c. In such a case, the second semiconductor layer 12 may be considered to be the portion 12p of the second semiconductor layer 12 recited above (referring to FIG. 1A). In such a case, the first insulating layer 41 may be considered to be the first insulating region 41a (referring to FIG. 1A). In the example, the first semiconductor layer 11 is GaN; the second semiconductor layer 12 is $Al_{0.25}Ga_{0.75}N$; and the first insulating layer 41 is $SiO_2$.

As shown in FIG. 5A, the concentration C(Mg) of Mg in the second semiconductor layer 12 (the portion 12p of the second semiconductor layer 12 recited above) is lower than the concentration C(Mg) of Mg in the first semiconductor layer 11 (the third partial region 11c).

As shown in FIG. 5A, the concentration C(H) of hydrogen in the second semiconductor layer 12 (the portion 12p of the second semiconductor layer 12 recited above) is lower than the concentration C(Mg) of Mg in the second semiconductor layer 12 (the portion 12p of the second semiconductor layer 12 recited above). For example, the concentration C(H) of hydrogen in the second semiconductor layer 12 (the portion 12p of the second semiconductor layer 12 recited above) may be less than 1/10 of the concentration C(Mg) of Mg in the second semiconductor layer 12 (the portion 12p of the second semiconductor layer 12 recited above).

As shown in FIG. 5A, the concentration C(H) of hydrogen in the second semiconductor layer 12 (the portion 12p of the second semiconductor layer 12 recited above) is lower than the concentration C(H) of hydrogen in the first semiconductor layer 11 (the third partial region 11c).

As shown in FIG. 5B, a peak of nitrogen may be detected between the second semiconductor layer 12 and the first insulating layer 41. In the third sample SP3, the first layer 61 of SiN (referring to FIG. 2C) is provided; and the first layer 61 is removed after the first heat treatment. It is considered that the peak of nitrogen detected between the second semiconductor layer 12 and the first insulating layer 41 originates in the first layer 61. It is considered that the nitrogen included in the first layer 61 of SiN remains in the surface of the second semiconductor layer 12. A peak of silicon may be detected between the second semiconductor layer 12 and the first insulating layer 41. There is a possibility that the silicon included in the first layer 61 of SiN may remain in the surface of the second semiconductor layer 12.

Thus, in the embodiment, an intermediate region 65 that includes silicon and nitrogen may be provided between the first insulating layer 41 and the second semiconductor layer 12 (the portion 12p of the second semiconductor layer 12 recited above). The intermediate region 65 that includes at least one selected from the group consisting of silicon and nitrogen may be provided between the first insulating layer 41 and the second semiconductor layer 12 (the portion 12p of the second semiconductor layer 12 recited above).

Figure 6:
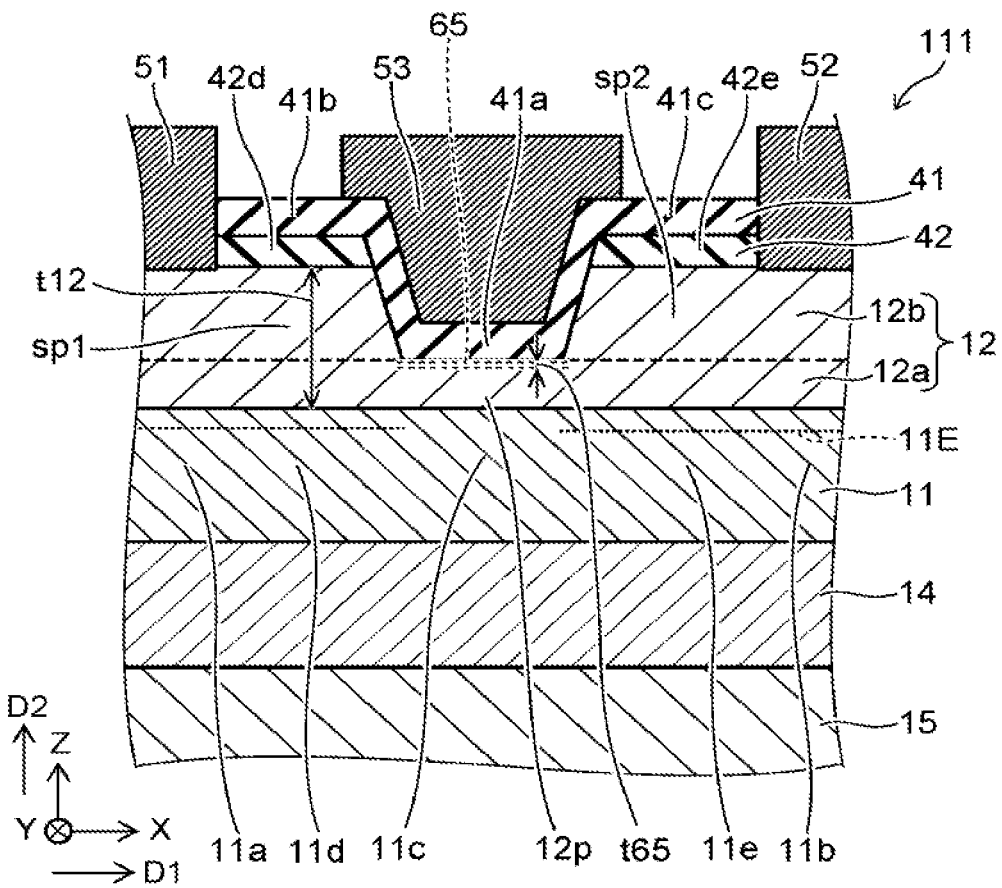
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, the semiconductor device 111 according to the embodiment may include the intermediate region 65. Otherwise, for example, the configuration of the semiconductor device 111 is similar to that of the semiconductor device 110. The intermediate region 65 is provided between the first insulating layer 41 (e.g., the first insulating region 41a) and the second semiconductor layer 12 (the portion 12p of the second semiconductor layer 12 recited above). A thickness t65 along the second direction D2 (the Z-axis direction) of the intermediate region 65 is, for example, not less than 1 nm and not more than 5 nm.

In the embodiment, the thickness t12 of the first semiconductor region sp1 (referring to FIG. 1A) is, for example, not less than 20 nm and not more than 50 nm. The thickness tp12 of the portion 12p of the second semiconductor layer 12 recited above (referring to FIG. 1A) is, for example, not less than 1 nm and not more than 10 nm. A thickness t41 of the first insulating region 41a (referring to FIG. 1A) is, for example, not less than 5 nm and not more than 100 nm.

In the description recited above, examples of the concentrations of Mg and hydrogen in the portions (the third partial region 11c, etc.) under the third electrode 53 (e.g., the gate electrode) are described. These concentrations are applicable to the fourth partial region 11d and the fifth partial region 11e of the first semiconductor layer 11.

For example, in one example according to the embodiment, the concentration C(H) of hydrogen in the fourth partial region 11d is less than 1/10 of the concentration C(Mg) of Mg in the fourth partial region 11d. For example, the concentration C(H) of hydrogen in the fourth partial region 11d is less than 1/10 of the concentration C(Mg) of Mg in the fourth partial region 11d, and may be not less than 1/1000 of the concentration C(Mg) of Mg in the fourth partial region 11d.

For example, the concentration C(Mg) of magnesium in the fourth partial region 11d is less than $1\times10^{18}/cm^3$. For example, the concentration C(Mg) of magnesium is greater than $1\times10^{15}/cm^3$. For example, the concentration C(H) of hydrogen in the fourth partial region 11d is less than $1\times10^{17}/cm^3$. The concentration C(H) of hydrogen in the fourth partial region 11d is greater than $1\times10^{14}/cm^3$. Such characteristics relating to the concentration of the fourth partial region 11d are applicable to the fifth partial region 11e.

For example, the concentration C(Mg) of Mg in the first semiconductor region sp1 is lower than the concentration C(Mg) of Mg in the fourth partial region 11d. For example, the concentration C(H) of hydrogen in the first semiconductor region sp1 is lower than the concentration C(Mg) of Mg in the first semiconductor region sp1. For example, the concentration C(H) of hydrogen in the first semiconductor region sp1 is lower than the concentration C(H) of hydrogen in the fourth partial region 11d.

For example, the concentration C(Mg) of Mg in the second semiconductor region sp2 is lower than the concentration C(Mg) of Mg in the fifth partial region 11e. For example, the concentration C(H) of hydrogen in the second semiconductor region sp2 is lower than the concentration C(Mg) of Mg in the second semiconductor region sp2. For example, the concentration C(H) of hydrogen in the second semiconductor region sp2 is lower than the concentration C(H) of hydrogen in the fifth partial region 11e.

Second Embodiment

A second embodiment relates to a method for manufacturing a semiconductor device.

Figure 7:
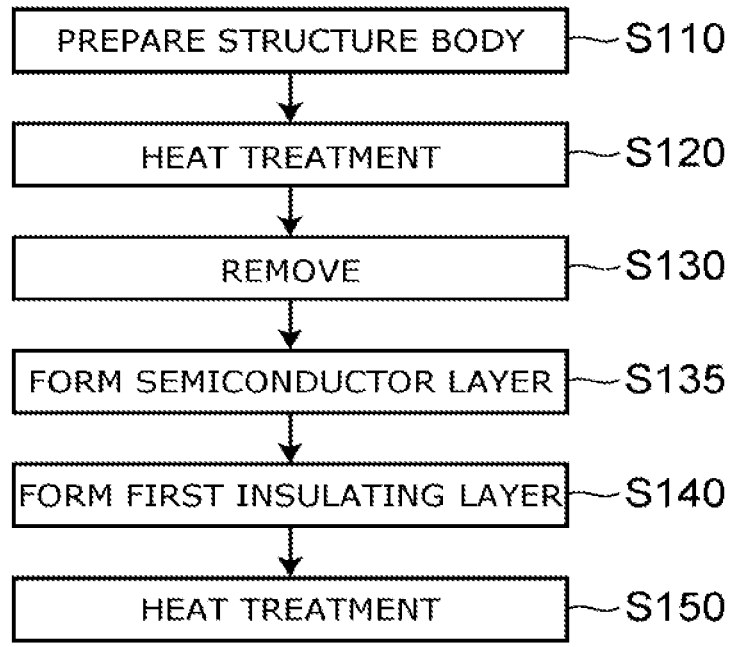
FIG. 7 is a flowchart illustrating a method for manufacturing a semiconductor device according to the second embodiment.

FIG. 7 is a flowchart illustrating the method for manufacturing the semiconductor device according to the second embodiment.

As shown in FIG. 7, the structure body 10S (referring to FIG. 2B) is prepared (step S110). The structure body 10S includes the first layer 61, the second semiconductor layer 12 including $Al_{x2}Ga_{1-x2}N$ ($0<x2\leq1$ and $x1<x2$), and the first semiconductor layer 11 including $Al_{x1}Ga_{1-x1}N$ ($0\leq x1<1$) and including magnesium and hydrogen. The second semiconductor layer 12 is between the first semiconductor layer 11 and the first layer 61.

As shown in FIG. 7, heat treatment of the structure body 10S is performed (step S120). For example, the processing (the first heat treatment) described in reference to FIG. 2C is performed. The concentration of hydrogen in the first semiconductor layer 11 can be reduced thereby. The Mg in the first semiconductor layer 11 is activated by performing the first heat treatment. Thereby, the first semiconductor layer 11 can act effectively as a p-type semiconductor. Thereby, the threshold voltage stably can be high; and a normally-off characteristic is obtained stably. According to the embodiment, a method for manufacturing a semiconductor device can be provided in which the characteristics can be improved.

It is favorable for the first layer 61 to include silicon and nitrogen. The first layer 61 may include silicon and oxygen.

As shown in FIG. 7, at least a portion of the first layer 61 may be removed (step S130) after the heat treatment (the first heat treatment of step S120). The intermediate region 65 that includes silicon and nitrogen (referring to FIG. 5B) may be provided in the case where the first layer 61 includes silicon and nitrogen. The intermediate region 65 may include at least one selected from the group consisting of silicon and nitrogen.

As shown in FIG. 7, a semiconductor layer (the second portion 12b of the second semiconductor layer 12, etc.) may be formed as necessary (step S135) after step S130.

As shown in FIG. 7, the first insulating layer 41 is formed (step S140) after the heat treatment process (step S120). The first insulating layer 41 includes, for example, silicon and oxygen. The second insulating layer 42 may be formed before forming the first insulating layer 41.

As shown in FIG. 7, another heat treatment (the second heat treatment) is performed (step S150) after the process of forming the first insulating layer 41 (step S140). Subsequently, the first to third electrodes 51 to 53 are formed. Thus, the semiconductor device 110 or the semiconductor device 111 are obtained.

It is favorable for the temperature of the heat treatment in the first heat treatment to be, for example, not less than 600° C. and not more than 900° C. The time of the first heat treatment is, for example, not less than 5 minutes and not more than 30 minutes. For example, the first heat treatment is performed in an atmosphere including nitrogen. The proportion of nitrogen in the atmosphere including nitrogen is, for example, 90% or more.

According to the manufacturing method according to the embodiment, a method for manufacturing a semiconductor device can be provided in which the characteristics can be improved.

Several examples of the method for manufacturing the semiconductor device according to the embodiment will now be described.

FIG. 8A to FIG. 8I are schematic cross-sectional views illustrating a method for manufacturing a semiconductor device according to the second embodiment.

As shown in FIG. 8A, a stacked body that includes the first semiconductor layer 11 and the first portion 12a of the second semiconductor layer 12 is prepared. In the example, the intermediate layer 14 is provided on the substrate 15; and the first semiconductor layer 11 and the second semiconductor layer 12 are provided on the intermediate layer 14. As shown in FIG. 8B, the first layer 61 is formed on the stacked body. The first layer 61 is, for example, a SiN layer. The structure body 10S is obtained thereby (step S110). As shown in FIG. 8C, heat treatment of the structure body 10S is performed (step S120).

As shown in FIG. 8D, the first layer 61 is removed (step S130). As shown in FIG. 8E, a mask 71 is formed on a portion of the first portion 12a of the second semiconductor layer 12. For example, a SiN film or the like is used as the mask 71. A portion of the first layer 61 may be caused to remain in the removal of the first layer 61 recited above (step S130); and the remaining first layer 61 may be used as the mask 71.

As shown in FIG. 8F, the second portion 12b of the second semiconductor layer 12 is formed on the portion of the first portion 12a of the second semiconductor layer 12 not covered with the mask 71. The forming of the second portion 12b corresponds to at least a portion of step S135.

The mask 71 is removed as shown in FIG. 8G. The first insulating layer 41 is formed as shown in FIG. 8H (step S140). After the heat treatment (step S150) as shown in FIG. 8I, a portion of the first insulating layer 41 is removed; and the first to third electrodes 51 to 53 are formed. A portion of the second semiconductor layer 12 may be removed.

In the example as shown in FIG. 8I, the intermediate region 65 that includes silicon and nitrogen is formed in the region between the first portion 12a and the second portion 12b. The intermediate region 65 that includes silicon and nitrogen may be formed in a region of the first portion 12a opposing the first insulating layer 41.

FIG. 9A to FIG. 9I are schematic cross-sectional views illustrating a method for manufacturing a semiconductor device according to the second embodiment.

Figure 9A:
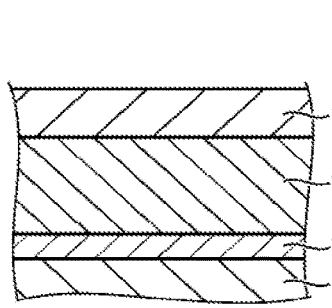
FIG. 9A to FIG. 9I are schematic cross-sectional views illustrating a method for manufacturing a semiconductor device according to the second embodiment.
Figure 9B:
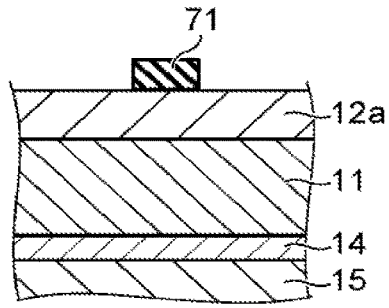
Figure 9C:
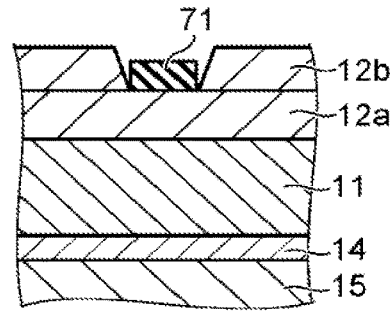
Figure 9D:
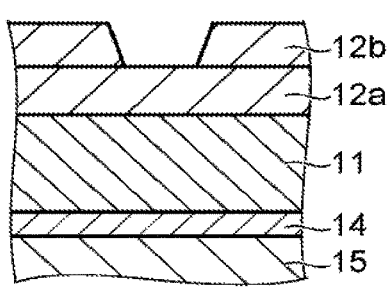

As shown in FIG. 9A, the stacked body that includes the first semiconductor layer 11 and the first portion 12a of the second semiconductor layer 12 is prepared. As shown in FIG. 9B, the mask 71 is formed on the stacked body. The mask 71 is, for example, a SiN film. As shown in FIG. 9C, the second portion 12b of the second semiconductor layer 12 is formed on the portion of the first portion 12a of the second semiconductor layer 12 not covered with the mask 71. The mask 71 is removed as shown in FIG. 9D.

Figure 9E:
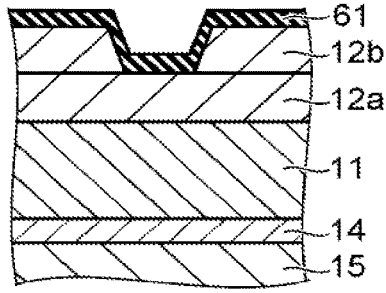

As shown in FIG. 9E, the first layer 61 is formed on the stacked body. The first layer 61 is, for example, a SiN layer.

Figure 9F:
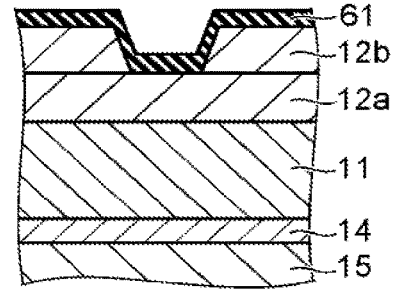

The structure body 10S is obtained thereby (step S110). As shown in FIG. 9F, heat treatment of the structure body 10S is performed (step S120).

Figure 9G:
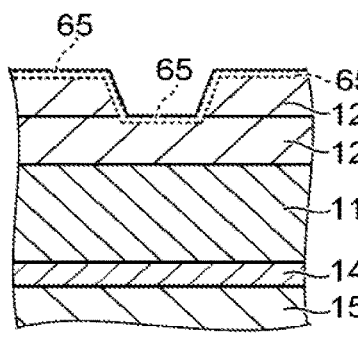
Figure 9H:
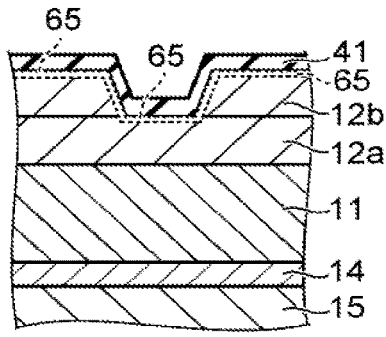
Figure 9I:
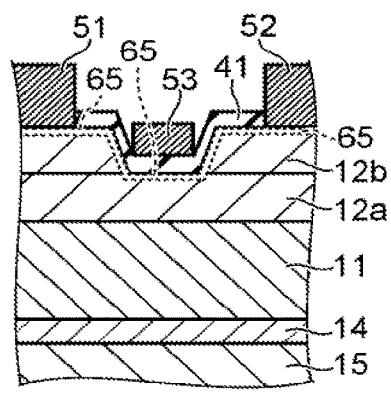

The first layer 61 is removed as shown in FIG. 9G (step S130). The first insulating layer 41 is formed as shown in FIG. 9H (step S140). The first insulating layer 41 is, for example, a $SiO_2$ layer. After the heat treatment (step S150) as shown in FIG. 9I, a portion of the first insulating layer 41 is removed; and the first to third electrodes 51 to 53 are formed. When forming the electrodes, the entire second semiconductor layer 12 may remain, or a portion of the second semiconductor layer 12 may remain.

In the example as shown in FIG. 9I, the intermediate region 65 that includes silicon and nitrogen is formed at the portion of the first portion 12a opposing the first insulating layer 41 and at the portion of the second portion 12b opposing the first insulating layer 41.

FIG. 10A to FIG. 10H are schematic cross-sectional views illustrating a method for manufacturing a semiconductor device according to the second embodiment.

Figure 10A:
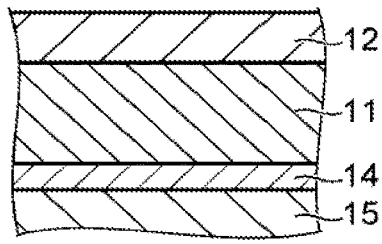
FIG. 10A to FIG. 10H are schematic cross-sectional views illustrating a method for manufacturing a semiconductor device according to the second embodiment.
Figure 10B:
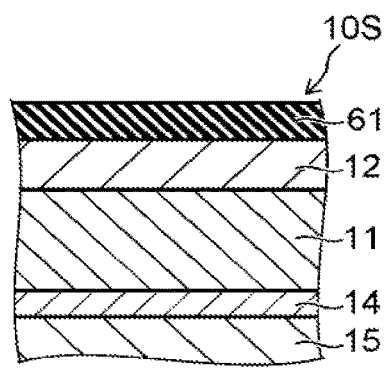
Figure 10C:
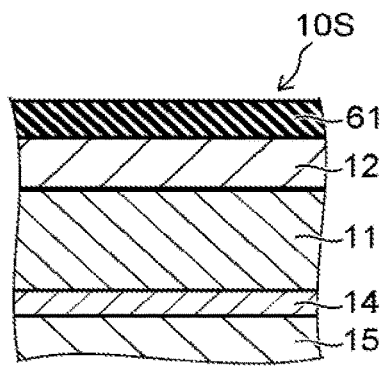

As shown in FIG. 10A, a stacked body that includes the first semiconductor layer 11 and the second semiconductor layer 12 is prepared. As shown in FIG. 10B, the first layer 61 is formed on the stacked body. The first layer 61 is, for example, a SiN layer. The structure body 10S is obtained thereby (step S110). As shown in FIG. 10C, heat treatment of the structure body 10S is performed (step S120).

Figure 10D:
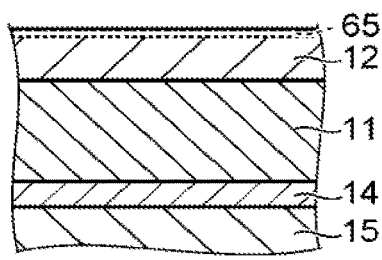
Figure 10E:
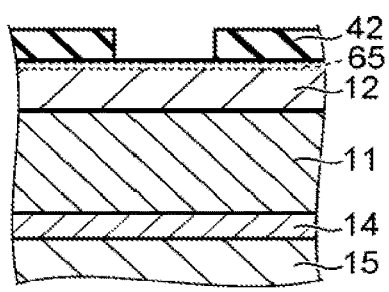
Figure 10F:
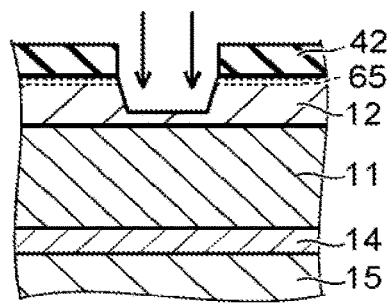

The first layer 61 is removed as shown in FIG. 10D (step S130). As shown in FIG. 10E, the second insulating layer 42 that has an opening is formed on the second semiconductor layer 12. The second insulating layer 42 is, for example, a SiN layer. As shown in FIG. 10F, a part of the portion of the second semiconductor layer 12 not covered with the second insulating layer 42 is removed via the opening of the second insulating layer 42. A portion of the second semiconductor layer 12 remains at the bottom portion of the opening. In the example, the bottom portion of the opening is the portion 12p of the second semiconductor layer 12.

Figure 10G:
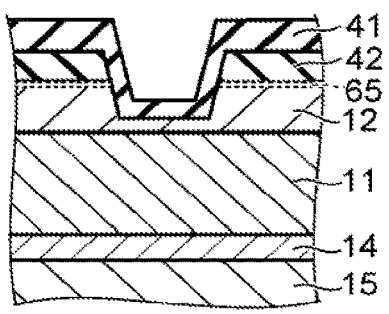
Figure 10H:
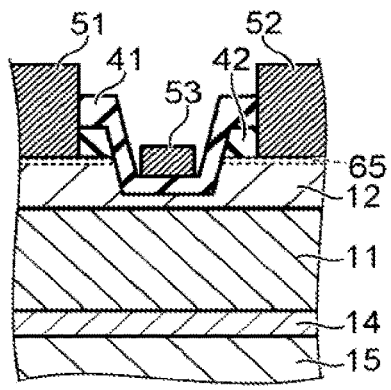

The first insulating layer 41 is formed as shown in FIG. 10G (step S140). The first insulating layer 41 is, for example, a $SiO_2$ layer. After the heat treatment (step S150) as shown in FIG. 10H, a portion of the first insulating layer 41 and a portion of the second insulating layer 42 are removed; and the first to third electrodes 51 to 53 are formed. When forming the electrodes, the entire second semiconductor layer 12 may remain, or a portion of the second semiconductor layer 12 may remain.

In the example as shown in FIG. 10H, the intermediate region 65 that includes silicon and nitrogen is formed in a region of the second semiconductor layer 12 opposing the second insulating layer 42.

FIG. 11A to FIG. 11I are schematic cross-sectional views illustrating a method for manufacturing a semiconductor device according to the second embodiment.

Figure 11A:
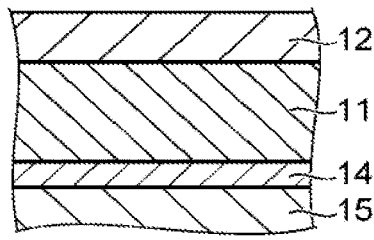
FIG. 11A to FIG. 11I are schematic cross-sectional views illustrating a method for manufacturing a semiconductor device according to the second embodiment.
Figure 11B:
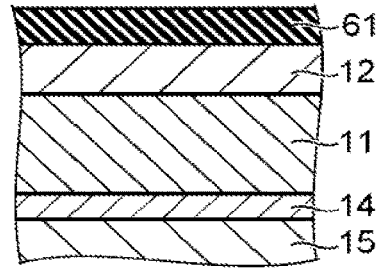
Figure 11C:
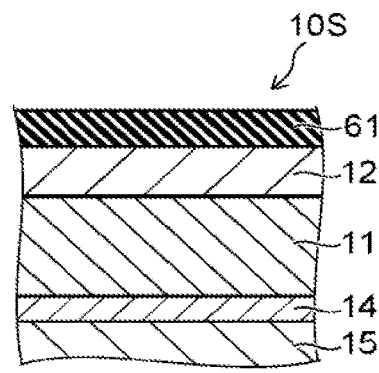

As shown in FIG. 11A, a stacked body that includes the first semiconductor layer 11 and the second semiconductor layer 12 is prepared. As shown in FIG. 11B, the first layer 61 is formed on the stacked body. The first layer 61 is, for example, a SiN layer. The structure body 10S is obtained thereby (step S110). As shown in FIG. 11C, heat treatment of the structure body 10S is performed (step S120).

Figure 11D:
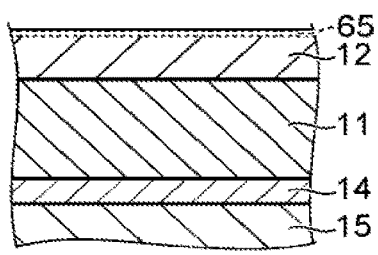
Figure 11E:
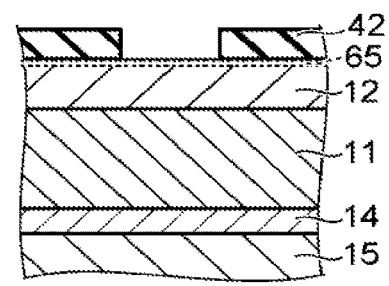
Figure 11F:
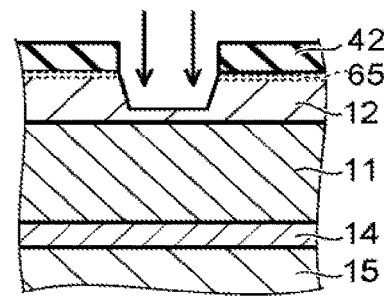

The first layer 61 is removed as shown in FIG. 11D (step S130). As shown in FIG. 11E, the second insulating layer 42 that has an opening is formed on the second semiconductor layer 12. The second insulating layer 42 is, for example, a SiN layer. As shown in FIG. 11F, a part of the portion of the second semiconductor layer 12 not covered with the second insulating layer 42 is removed via the opening of the second insulating layer 42. A portion of the second semiconductor layer 12 remains at the bottom portion of the opening.

Figure 11G:
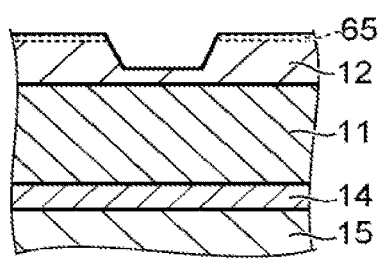
Figure 11H:
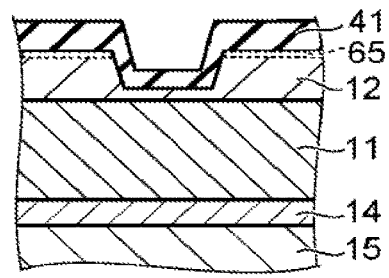

The second insulating layer 42 is removed as shown in FIG. 11G. The first insulating layer 41 is formed in FIG. 11H (step S140). The first insulating layer 41 is, for example, a $SiO_2$ layer. After the heat treatment (step S150) as shown in FIG. 10I, a portion of the first insulating layer 41 is removed; and the first to third electrodes 51 to 53 are formed. When forming the electrodes, the entire second semiconductor layer 12 may remain, or a portion of the second semiconductor layer 12 may remain.

Figure 11I:
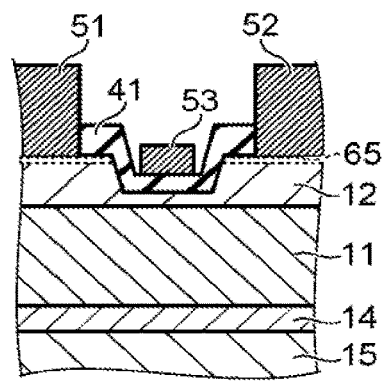

In the example as shown in FIG. 11I, the intermediate region 65 that includes silicon and nitrogen is formed in a region including the upper surface (e.g., the surface opposing the first insulating layer 41) of the second semiconductor layer 12.

FIG. 12A to FIG. 12I are schematic cross-sectional views illustrating a method for manufacturing a semiconductor device according to the second embodiment.

Figure 12A:
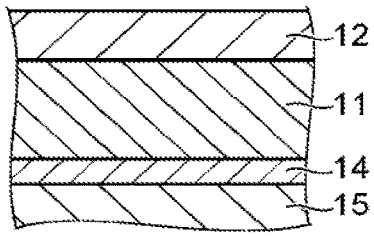
FIG. 12A to FIG. 12I are schematic cross-sectional views illustrating a method for manufacturing a semiconductor device according to the second embodiment.
Figure 12B:
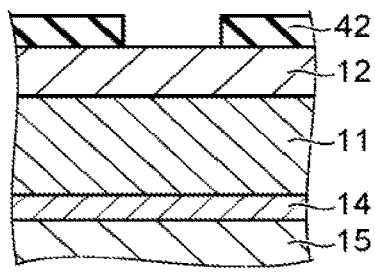
Figure 12C:
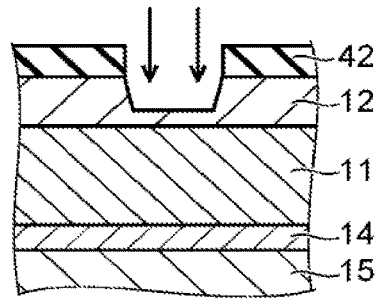

As shown in FIG. 12A, a stacked body that includes the first semiconductor layer 11 and the second semiconductor layer 12 is prepared. As shown in FIG. 12B, the second insulating layer 42 that has an opening is formed on the second semiconductor layer 12. The second insulating layer 42 is, for example, a SiN layer. As shown in FIG. 12C, a part of the portion of the second semiconductor layer 12 not covered with the second insulating layer 42 is removed via the opening of the second insulating layer 42. A portion of the second semiconductor layer 12 remains at the bottom portion of the opening. In the example, the bottom portion of the opening is the portion 12p of the second semiconductor layer 12.

Figure 12D:
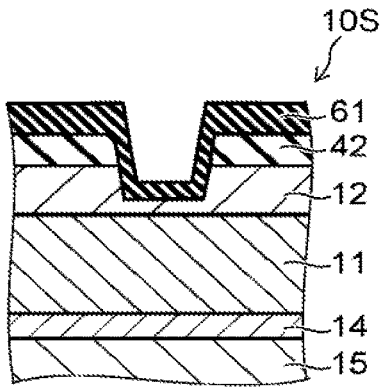
Figure 12E:
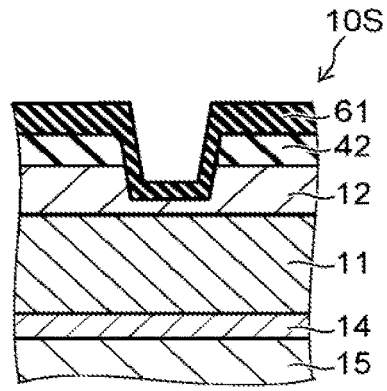
Figure 12F:
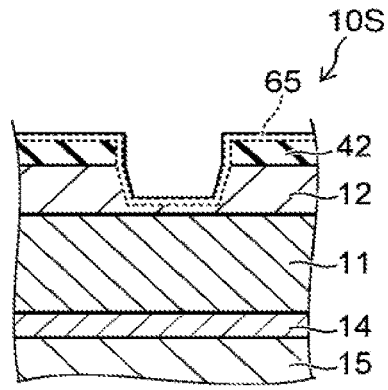

As shown in FIG. 12D, the first layer 61 is formed on the stacked body. The first layer 61 is, for example, a SiN layer. The structure body 10S is obtained thereby (step S110). As shown in FIG. 12E, heat treatment of the structure body 10S is performed (step S120). The first layer 61 is removed as shown in FIG. 12F (step S130).

Figure 12G:
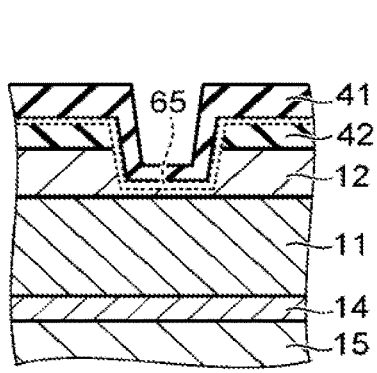
Figure 12H:
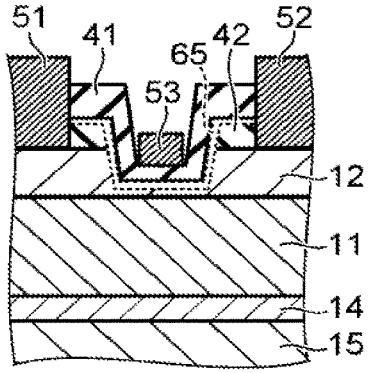

The first insulating layer 41 is formed as shown in FIG. 12G (step S140). The first insulating layer 41 is, for example, a $SiO_2$ layer. After the heat treatment (step S150) as shown in FIG. 12H, a portion of the first insulating layer 41 and a portion of the second insulating layer 42 are removed; and the first to third electrodes 51 to 53 are formed. When forming the electrodes, the entire second semiconductor layer 12 may remain, or a portion of the second semiconductor layer 12 may remain.

In the example as shown in FIG. 12G, the intermediate region 65 that includes silicon and nitrogen is formed at the portion of the second semiconductor layer 12 opposing the first insulating layer 41. The intermediate region 65 that includes silicon and nitrogen may be formed at a portion of the side surface of the opening (e.g., the side surface of the second semiconductor layer 12).

Figure 12I:
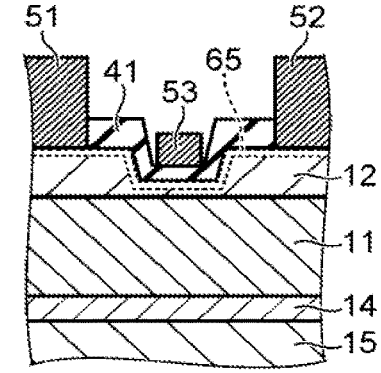

In the description recited above, the second insulating layer 42 may be removed when removing the portion of the second semiconductor layer 12 (referring to FIG. 12C). In such a case, the first layer 61 is formed to contact the second semiconductor layer 12. In such a case, as shown in FIG. 12I, the intermediate region 65 that includes silicon and nitrogen is formed at the portion of the second semiconductor layer 12 opposing the first insulating layer 41. The intermediate region 65 that includes silicon and nitrogen may be formed at a portion of the side surface of the opening (e.g., the side surface of the second semiconductor layer 12).

FIG. 13A to FIG. 13I are schematic cross-sectional views illustrating a method for manufacturing a semiconductor device according to the second embodiment.

As shown in FIG. 13A, a stacked body that includes the first semiconductor layer 11 and a semiconductor film 12f which is used to form a portion of the second semiconductor layer 12 is prepared. The semiconductor film 12f includes $Al_{x2}Ga_{1-x2}N$ ($0<x2\leq1$ and $x1<x2$). As shown in FIG. 13B, the first layer 61 is formed on the stacked body. The first layer 61 is, for example, a SiN layer. The structure body 10S is obtained thereby (step S110). As shown in FIG. 13C, heat treatment of the structure body 10S is performed (step S120).

The first layer 61 is removed as shown in FIG. 13D (step S130). As shown in FIG. 13E, the second insulating layer 42 that has an opening is formed on the semiconductor film 12f. The second insulating layer 42 is, for example, a SiN layer. As shown in FIG. 13F, a part of the portion of the semiconductor film 12f not covered with the second insulating layer 42 is removed via the opening of the second insulating layer 42. The first semiconductor layer 11 is exposed at the bottom portion of the opening.

As shown in FIG. 13G, a semiconductor film 12g which is used to form another portion of the second semiconductor layer 12 is formed. The semiconductor film 12g includes $Al_{x2}Ga_{1-x2}N$ ($0<x2\leq1$ and $x1<x2$). The composition of the semiconductor film 12g may be the same as or different from the composition of the semiconductor film 12f. The first insulating layer 41 is formed as shown in FIG. 13H (step S140). The first insulating layer 41 is, for example, a $SiO_2$ layer. After the heat treatment (step S150) as shown in FIG. 13I, a portion of the first insulating layer 41, a portion of the semiconductor film 12g, and a portion of the second insulating layer 42 are removed; and the first to third electrodes 51 to 53 are formed. When forming the electrodes, the entire semiconductor film 12f may remain, or a portion of the semiconductor film 12f may remain.

In the example, the semiconductor film 12f is used to form the first semiconductor region sp1 and the second semiconductor region sp2 of the second semiconductor layer 12. A portion of the semiconductor film 12g is used to form the portion 12p of the second semiconductor layer 12.

In the example as shown in FIG. 13I, the intermediate region 65 that includes silicon and nitrogen is formed in a region including the upper surface (a portion of the second semiconductor layer 12, e.g., the surface opposing the second insulating layer 42) of the semiconductor film 12f.

FIG. 14A to FIG. 14J are schematic cross-sectional views illustrating a method for manufacturing a semiconductor device according to the second embodiment.

Figure 14A:
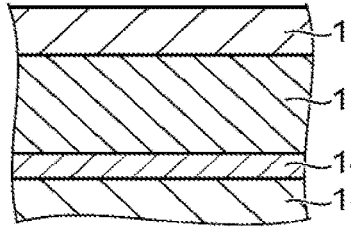
FIG. 14A to FIG. 14J are schematic cross-sectional views illustrating a method for manufacturing a semiconductor device according to the second embodiment.
Figure 14B:
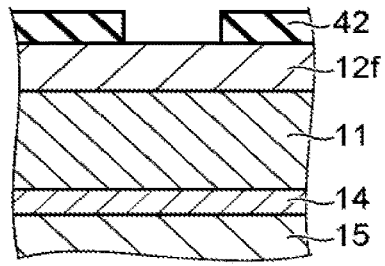
Figure 14C:
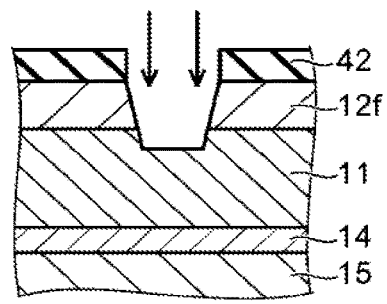

As shown in FIG. 14A, a stacked body that includes the first semiconductor layer 11 and the semiconductor film 12f which is used to form a portion of the second semiconductor layer 12 is prepared. The semiconductor film 12f includes $Al_{x2}Ga_{1-x2}N$ ($0<x2\leq1$ and $x1<x2$). As shown in FIG. 14B, the second insulating layer 42 that has an opening is formed on the semiconductor film 12f. The second insulating layer 42 is, for example, a SiN layer. As shown in FIG. 14C, a part of the portion of the semiconductor film 12f not covered with the second insulating layer 42 is removed via the opening of the second insulating layer 42. The first semiconductor layer 11 is exposed at the bottom portion of the opening.

Figure 14D:
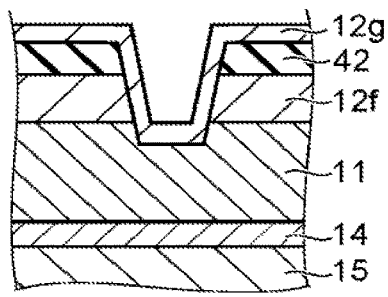

As shown in FIG. 14D, the semiconductor film 12g which is used to form another portion of the second semiconductor layer 12 is formed. The semiconductor film 12g includes $Al_{x2}Ga_{1-x2}N$ ($0<x2\leq1$ and $x1<x2$). The composition of the semiconductor film 12g may be the same as or different from the composition of the semiconductor film 12f.

Figure 14E:
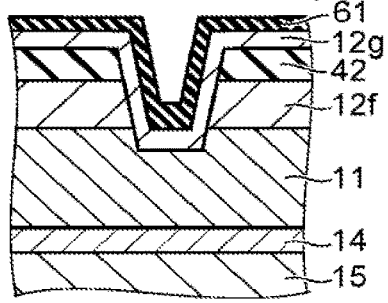
Figure 14F:
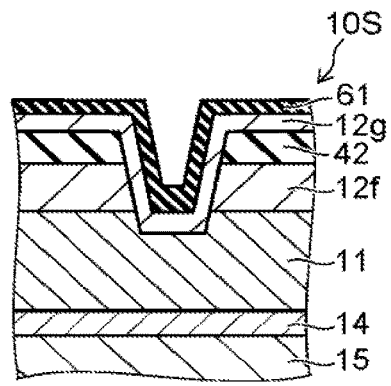
Figure 14G:
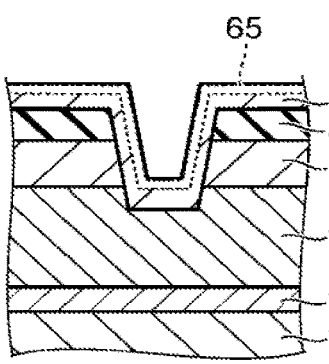

As shown in FIG. 14E, the first layer 61 is formed on the semiconductor film 12g. The first layer 61 is, for example, a SiN layer. The structure body 10S is obtained thereby (step S110). As shown in FIG. 14F, heat treatment of the structure body 10S is performed (step S120). The first layer 61 is removed as shown in FIG. 14G (step S130).

Figure 14H:
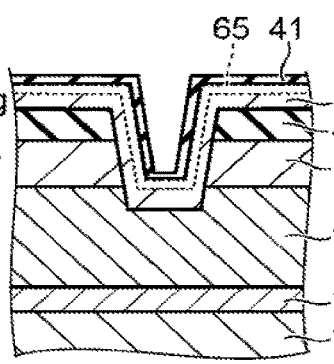
Figure 14I:
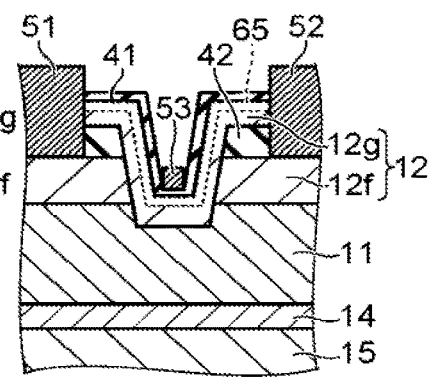

As shown in FIG. 14H, the first insulating layer 41 is formed on the semiconductor film 12g (step S140). The first insulating layer 41 is, for example, a $SiO_2$ layer. After the heat treatment (step S150) as shown in FIG. 14I, a portion of the first insulating layer 41, a portion of the semiconductor film 12g, and a portion of the second insulating layer 42 are removed; and the first to third electrodes 51 to 53 are formed. When forming the electrodes, the entire semiconductor film 12f may remain, or a portion of the semiconductor film 12f may remain.

In the example, the semiconductor film 12f is used to form the first semiconductor region sp1 and the second semiconductor region sp2 of the second semiconductor layer 12. A portion of the semiconductor film 12g is used to form the portion 12p of the second semiconductor layer 12.

In the example as shown in FIG. 14I, the intermediate region 65 that includes silicon and nitrogen is formed in a region including the upper surface (a portion of the second semiconductor layer 12, e.g., the surface opposing the first insulating layer 41) of the semiconductor film 12g.

Figure 14J:
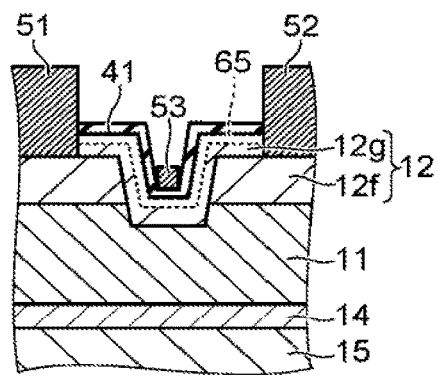

In the description recited above, the second insulating layer 42 may be removed when removing the portion of the second semiconductor layer 12 (referring to FIG. 14C). In such a case, as shown in FIG. 14J, the intermediate region 65 that includes silicon and nitrogen is formed at the portion of the second semiconductor layer 12 opposing the first insulating layer 41.

FIG. 15A to FIG. 15J are schematic cross-sectional views illustrating a method for manufacturing a semiconductor device according to the second embodiment.

Figure 15A:
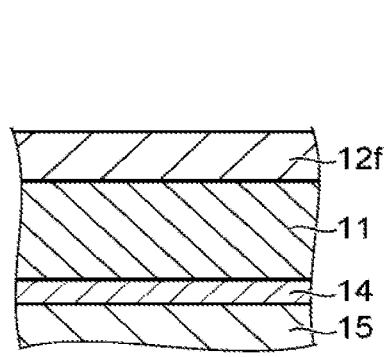
FIG. 15A to FIG. 15J are schematic cross-sectional views illustrating a method for manufacturing a semiconductor device according to the second embodiment.
Figure 15B:
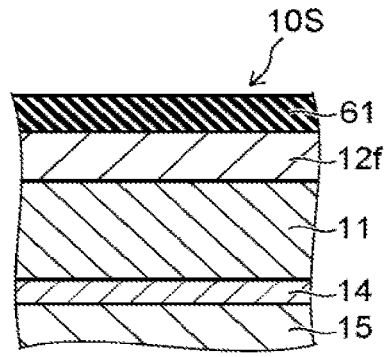
Figure 15C:
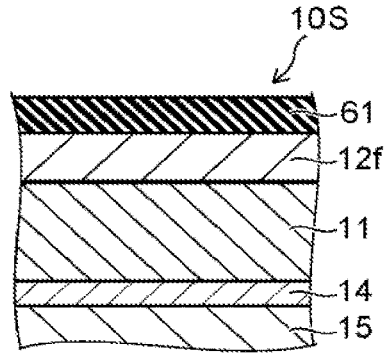

As shown in FIG. 15A, a stacked body that includes the first semiconductor layer 11 and the semiconductor film 12f which is used to form a portion of the second semiconductor layer 12 is prepared. As shown in FIG. 15B, the first layer 61 is formed on the stacked body. The first layer 61 is, for example, a SiN layer. The structure body 10S is obtained thereby (step S110). As shown in FIG. 15C, heat treatment of the structure body 10S is performed (step S120).

Figure 15D:
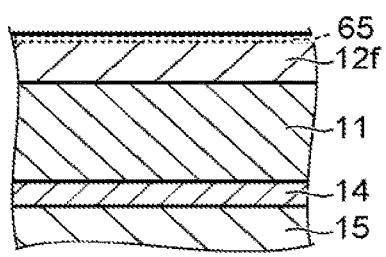
Figure 15E:
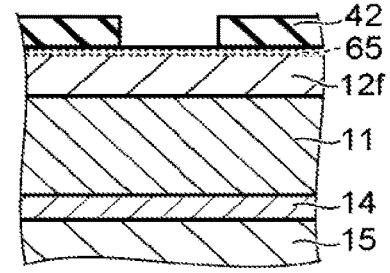
Figure 15F:
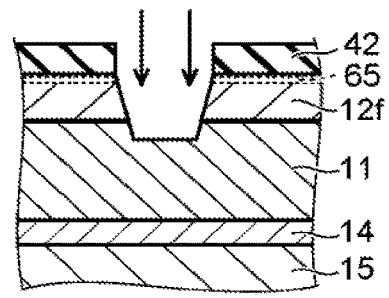

The first layer 61 is removed as shown in FIG. 15D (step S130). As shown in FIG. 15E, the second insulating layer 42 that has an opening is formed on the semiconductor film 12f. The second insulating layer 42 is, for example, a SiN layer. As shown in FIG. 15F, a part of the portion of the semiconductor film 12f not covered with the second insulating layer 42 is removed via the opening of the second insulating layer 42. The first semiconductor layer 11 is exposed at the bottom portion of the opening.

Figure 15G:
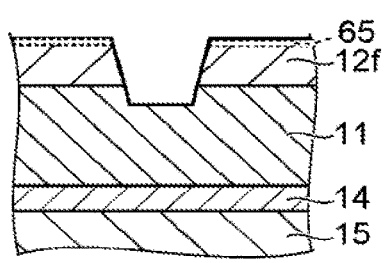
Figure 15H:
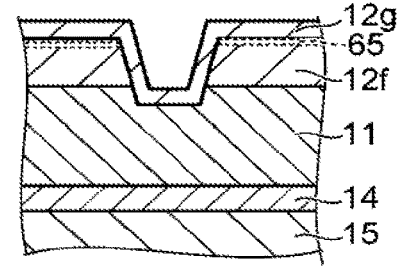
Figure 15I:
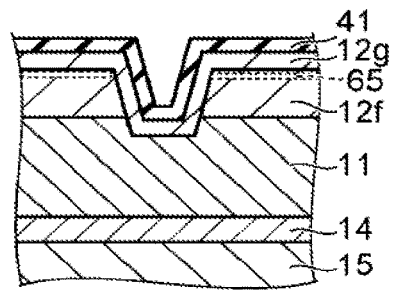
Figure 15J:
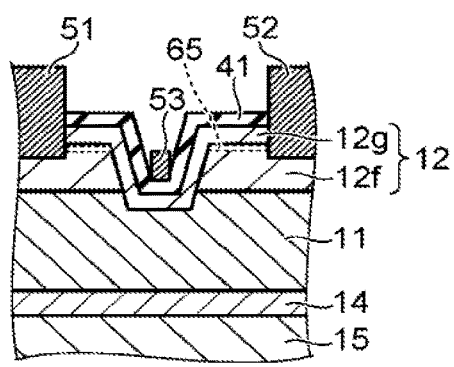

The second insulating layer 42 is removed as shown in FIG. 15G. As shown in FIG. 15H, the semiconductor film 12g which is used to form another portion of the second semiconductor layer 12 is formed. The first insulating layer 41 is formed as shown in FIG. 15I (step S140). The first insulating layer 41 is, for example, a $SiO_2$ layer. After the heat treatment (step S150) as shown in FIG. 15J, a portion of the first insulating layer 41 is removed; and the first to third electrodes 51 to 53 are formed. When forming the electrodes, the entire semiconductor film 12g may remain, or a portion of the semiconductor film 12g may remain. When forming the electrodes, the entire semiconductor film 12f may remain, or a portion of the semiconductor film 12f may remain.

In the example, the semiconductor film 12f and the semiconductor film 12g are used to form the first semiconductor region sp1 and the second semiconductor region sp2 of the second semiconductor layer 12. A portion of the semiconductor film 12g is used to form the portion 12p of the second semiconductor layer 12.

In the example as shown in FIG. 15J, the intermediate region 65 that includes silicon and nitrogen is formed in a region of the semiconductor film 12f (a portion of the second semiconductor layer 12) opposing the semiconductor film 12g.

Third Embodiment

Figure 16:
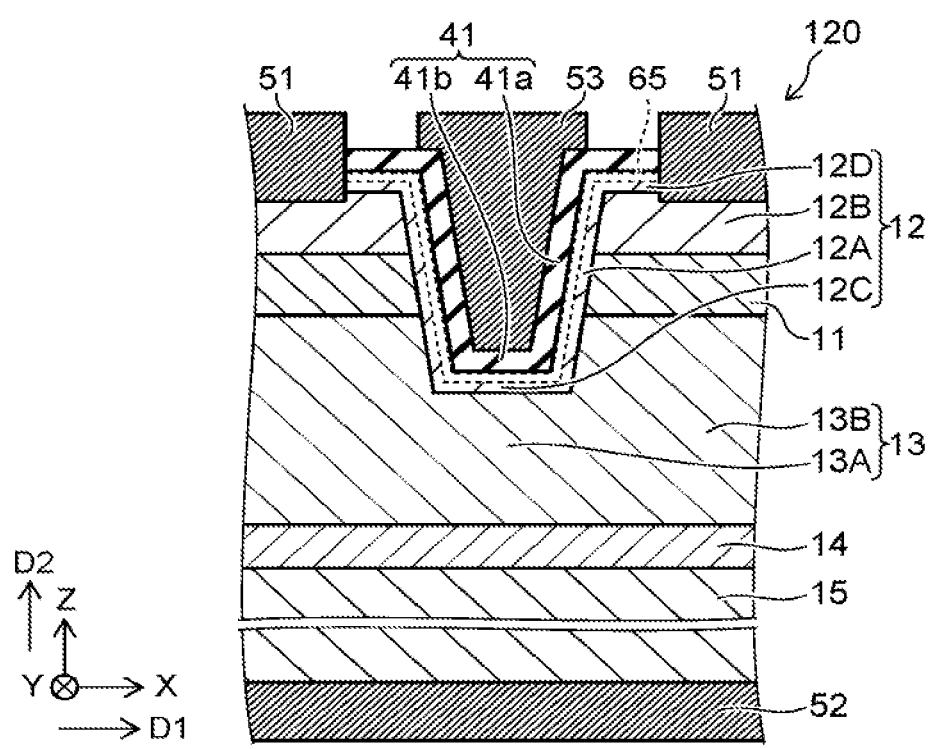
FIG. 16 is a schematic cross-sectional view illustrating a semiconductor device according to a third embodiment.

FIG. 16 is a schematic cross-sectional view illustrating a semiconductor device according to a third embodiment.

As shown in FIG. 16, the semiconductor device 120 according to the second embodiment includes the first electrode 51, the second electrode 52, the third electrode 53, the first semiconductor layer 11, the second semiconductor layer 12, and the first insulating layer 41.

In the example, the direction from the third electrode 53 toward the first electrode 51 is taken as the first direction D1. The first direction is taken as the X-axis direction. The direction from the second electrode 52 toward the third electrode 53 is taken as the second direction D2. The first direction D1 from the third electrode 53 toward the first electrode 51 crosses the second direction D2 from the second electrode 52 toward the third electrode 53. The second direction D2 is, for example, the Z-axis direction.

The first semiconductor layer 11 includes $Al_{x1}Ga_{1-x1}N$ ($0 \leq x1 < 1$). The first semiconductor layer 11 includes, for example, GaN. The first semiconductor layer 11 includes Mg. The direction from the third electrode 53 toward the first semiconductor layer 11 is aligned with the first direction D1. The direction from the first semiconductor layer 11 toward the first electrode 51 is aligned with the second direction D2 (e.g., the Z-axis direction).

The second semiconductor layer 12 includes $Al_{x2}Ga_{1-x2}N$ ($0 < x2 \leq 1$ and $x1 < x2$). The second semiconductor layer 12 includes a first semiconductor region 12A. The first semiconductor region 12A is between the third electrode 53 and the first semiconductor layer 11 in the first direction D1.

The first insulating layer 41 includes the first insulating region 41a. The first insulating region 41a is between the third electrode 53 and the first semiconductor region 12A in the first direction D1.

The concentration of hydrogen in the first semiconductor layer 11 is less than 1/10 of the concentration of magnesium in the first semiconductor layer 11.

In the semiconductor device 120, for example, the first electrode 51 functions as a source electrode. For example, the second electrode 52 functions as a drain electrode. For example, the third electrode 53 functions as a gate electrode.

In the semiconductor device 120, for example, a carrier region is formed in a region of the first semiconductor layer 11 opposing the first semiconductor region 12A. A low on-resistance is obtained in the semiconductor device 120. In the embodiment, the concentration of hydrogen in the first semiconductor layer 11 is low; and the first semiconductor layer 11 acts effectively as a p-type semiconductor. Because the first semiconductor layer 11 acts as a p-type semiconductor, the carrier region locally disappears more easily in the first semiconductor layer 11. Therefore, The threshold voltage stably can be high. For example, a normally-off characteristic is obtained stably. According to the third embodiment, a semiconductor device can be provided in which the characteristics can be improved.

In the example as shown in FIG. 16, the second semiconductor layer 12 further includes a second semiconductor region 12B. The first semiconductor layer 11 is between the second electrode 52 and the second semiconductor region 12B in the second direction (e.g., the Z-axis direction). The direction from the first semiconductor layer 11 toward the second semiconductor region 12B is aligned with the second direction D2 (e.g., the Z-axis direction). The direction from the third electrode 53 toward the second semiconductor region 12B is aligned with the first direction D1. The first electrode 51 is electrically connected to at least one of the first semiconductor layer 11 or the second semiconductor region 12B. For example, the second semiconductor region 12B contacts the first semiconductor layer 11.

For example, the second semiconductor region 12B is of the n-type. The second semiconductor region 12B includes, for example, at least one selected from the group consisting of Si, Ge, and Sn. Or, the concentration of Mg in the second semiconductor region 12B is, for example, less than $1 \times 10^{18}/cm^3$. The concentration of Mg in the second semiconductor region 12B may be, for example, less than $1 \times 10^{17}/cm^3$.

For example, the first semiconductor region 12A is of the n-type. The first semiconductor region 12A includes, for example, at least one selected from the group consisting of Si, Ge, and Sn. Or, the concentration of Mg in the first semiconductor region 12A is, for example, less than $1 \times 10^{18}/cm^3$. The concentration of Mg in the first semiconductor region 12A may be, for example, less than $1 \times 10^{17}/cm^3$.

In the example as shown in FIG. 16, the semiconductor device 120 includes a third semiconductor layer 13. The third semiconductor layer 13 includes $Al_{x3}Ga_{1-x3}N$ ($0 \leq x3 < 1$ and $x3 < x2$). The third semiconductor layer 13 includes, for example, GaN. For example, the third semiconductor layer 13 is of the n-type. For example, the third semiconductor layer 13 includes at least one selected from the group consisting of Si, Ge, and Sn. Or, the concentration of Mg in the third semiconductor layer 13 is, for example, less than $1 \times 10^{18}/cm^3$. The concentration of Mg in the third semiconductor layer 13 may be, for example, less than $1 \times 10^{17}/cm^3$.

The third semiconductor layer 13 includes a first partial region 13A and a second partial region 13B. The first partial region 13A is between the second electrode 52 and the third electrode 53 in the second direction D2 (e.g., the Z-axis direction). For example, at least a portion of the first semiconductor layer 11 is between the second partial region 13B and the first electrode 51 in the second direction D2 (e.g., the Z-axis direction). The second partial region 13B is between the first semiconductor layer 11 and a portion of the second electrode 52 in the second direction D2 (e.g., the Z-axis direction).

In the example as shown in FIG. 16, the second semiconductor layer 12 further includes a third semiconductor region 12C. The third semiconductor region 12C is between the first partial region 13A and the third electrode 53 in the second direction (e.g., the Z-axis direction). The first insulating layer 41 further includes the second insulating region 41b. The second insulating region 41b is between the third semiconductor region 12C and the third electrode 53 in the second direction D2. For example, the first insulating region 41a and the second insulating region 41b function as a gate insulating film.

In the example as shown in FIG. 16, the semiconductor device 120 further includes the substrate 15 and the intermediate layer 14. The first semiconductor layer 11 is between the substrate 15 and the second semiconductor layer 12. The third semiconductor layer 13 is between the substrate 15 and the first semiconductor layer 11. The intermediate layer 14 is between the substrate 15 and the third semiconductor layer 13. The intermediate layer 14 may include, for example, a buffer layer. The buffer layer includes, for example, a nitride film including Al. Multiple stacked nitride films may be provided in the buffer layer. For example, the substrate 15 and the intermediate layer 14 are of the n-type. The second electrode 52 is electrically connected to the third semiconductor layer 13. For example, the electrical connection is performed via the substrate 15 and the intermediate layer 14. For example, at least a portion of the substrate 15 may be removed. For example, at least a portion of the intermediate layer 14 may be removed.

In the example as shown in FIG. 16, the second semiconductor layer 12 further includes a fourth semiconductor region 12D. The second semiconductor region 12B is between the first semiconductor layer 11 and the fourth semiconductor region 12D in the second direction D2. The fourth semiconductor region 12D is between the second semiconductor region 12B and a portion of the first insulating layer 41.

The concentration of magnesium in the first semiconductor layer 11 is, for example, less than $1 \times 10^{18}/cm^3$. The concentration of hydrogen in the first semiconductor layer 11 is, for example, less than $1 \times 10^{17}/cm^3$. The concentration of hydrogen in the first semiconductor layer 11 is, for example, greater than $1 \times 10^{14}/cm^3$.

For example, the concentration of magnesium in the first semiconductor region 12A is lower than the concentration of magnesium in the first semiconductor layer 11. For example, the concentration of hydrogen in the first semiconductor region 12A is lower than the concentration of magnesium in the first semiconductor region 12A. For example, the concentration of hydrogen in the first semiconductor region 12A is lower than the concentration of hydrogen in the first semiconductor layer 11.

For example, the concentration of magnesium in the second semiconductor region 12B is lower than the concentration of magnesium in the first semiconductor layer 11. For example, the concentration of hydrogen in the second semiconductor region 12B is lower than the concentration of magnesium in the second semiconductor region 12B. For example, the concentration of hydrogen in the second semiconductor region 12B is lower than the concentration of hydrogen in the first semiconductor layer 11.

As shown in FIG. 16, the semiconductor device 120 may further include the intermediate region 65. The intermediate region 65 includes, for example, silicon and nitrogen. The intermediate region 65 may include at least one selected from the group consisting of silicon and nitrogen. For example, the intermediate region 65 is between the third electrode 53 and the first semiconductor layer 11 in the first direction D1 (the X-axis direction). The thickness along the first direction D1 of the intermediate region 65 is, for example, not less than 1 nm and not more than 5 nm.

Fourth Embodiment

A fourth embodiment relates to a method for manufacturing the semiconductor device 120 according to the third embodiment. An example of the method for manufacturing the semiconductor device according to the fourth embodiment will now be described.

FIG. 17A to FIG. 17J are schematic cross-sectional views illustrating the method for manufacturing the semiconductor device according to the fourth embodiment.

As shown in FIG. 17A, a stacked body that includes the first semiconductor layer 11 and the semiconductor film 12f which is used to form a portion of the second semiconductor layer 12 is prepared. In the example, the stacked body includes the third semiconductor layer 13. As shown in FIG. 17B, the mask 71 that has an opening is formed on the stacked body. The mask 71 is, for example, a SiN film. As shown in FIG. 17C, a part of the portions of the semiconductor film 12f and the first semiconductor layer 11 not covered with the mask 71 is removed via the opening of the mask 71. The third semiconductor layer 13 is exposed at the bottom portion of the opening.

The mask 71 is removed as shown in FIG. 17D. At least a portion of the mask 71 may remain after removing the mask 71 and may be used as the second insulating layer 42. As shown in FIG. 17E, the semiconductor film 12g which is used to form another portion of the second semiconductor layer 12 is formed.

The first layer 61 is formed as shown in FIG. 17F. The structure body 10S is obtained thereby (step S110). As shown in FIG. 17G, heat treatment of the structure body 10S is performed (step S120).

The first layer 61 is removed as shown in FIG. 17H (step S130). The first insulating layer 41 is formed as shown in FIG. 17I (step S140). The first insulating layer 41 is, for example, a $SiO_2$ layer. After the heat treatment (step S150) as shown in FIG. 17J, a portion of the first insulating layer 41 is removed; and the first to third electrodes 51 to 53 are formed. The semiconductor device 120 according to the third embodiment is formed thereby. When forming the electrodes, the entire semiconductor film 12g may remain, or a portion of the semiconductor film 12g may remain. The entire semiconductor film 12f may remain, or a portion of the semiconductor film 12f may remain.

In the semiconductor device 120, the semiconductor film 12f and the semiconductor film 12g correspond to the second semiconductor layer 12. For example, the semiconductor film 12f corresponds to the second semiconductor region 12B. For example, the semiconductor film 12g corresponds to the first semiconductor region 12A, the third semiconductor region 12C, and the fourth semiconductor region 12D.

In the example as shown in FIG. 17J, the intermediate region 65 that includes silicon and nitrogen is formed at a portion of the second semiconductor layer 12.

According to the method for manufacturing the semiconductor device according to the fourth embodiment, a method for manufacturing a semiconductor device can be provided in which the characteristics can be improved.

The embodiments may include, for example, the following configurations (technological proposals).

Configuration 1

A semiconductor device, comprising:
a first electrode;
a second electrode;
a third electrode, a first direction from the third electrode toward the first electrode crossing a second direction from the second electrode toward the third electrode;
a first semiconductor layer including $Al_{x1}Ga_{1-x1}N$ ($0 \le x1 < 1$), a direction from the third electrode toward the first semiconductor layer being aligned with the first direction, a direction from the first semiconductor layer toward the first electrode being aligned with the second direction;

a second semiconductor layer including $Al_{x2}Ga_{1-x2}N$ ($0<x2\leq1$ and $x1<x2$) and including a first semiconductor region, the first semiconductor region being between the third electrode and the first semiconductor layer in the first direction; and a first insulating layer including a first insulating region, the first insulating region being between the third electrode and the first semiconductor region in the first direction, a concentration of hydrogen in the first semiconductor layer being less than 1/10 of a concentration of magnesium in the first semiconductor layer.

Configuration 2

The semiconductor device according to Configuration 1, wherein the second semiconductor layer further includes a second semiconductor region, the first semiconductor layer is between the second electrode and the second semiconductor region in the second direction, a direction from the third electrode toward the second semiconductor region is aligned with the first direction, and the first electrode is electrically connected to at least one of the first semiconductor layer or the second semiconductor region.

Configuration 3

The semiconductor device according to Configuration 2, wherein the second semiconductor region contacts the first semiconductor layer.

Configuration 4

The semiconductor device according to Configuration 2 or 3, wherein the second semiconductor region includes at least one selected from the group consisting of Si, Ge, and Sn, or a concentration of Mg in the second semiconductor region is less than $1\times10^{18}/cm^3$.

Configuration 5

The semiconductor device according to any one of Configurations 1 to 4, wherein the first semiconductor region includes at least one selected from the group consisting of Si, Ge, and Sn, or a concentration of Mg in the first semiconductor region is less than $1\times10^{18}/cm^3$.

Configuration 6

The semiconductor device according to any one of Configurations 1 to 5, further comprising a third semiconductor layer including $Al_{x3}Ga_{1-x3}N$ ($0\leq x3<1$ and $x3<x2$), the third semiconductor layer including at least one selected from the group consisting of Si, Ge, and Sn, or a concentration of Mg in the third semiconductor layer being less than $1\times10^{18}/cm^3$, the third semiconductor layer including a first partial region and a second partial region, the first partial region being between the second electrode and the third electrode in the second direction, at least a portion of the first semiconductor layer being between the second partial region and the first electrode in the second direction.

Configuration 7

The semiconductor device according to Configuration 6, wherein the second partial region is between the first semiconductor layer and a portion of the second electrode in the second direction.

Configuration 8

The semiconductor device according to Configuration 6 or 7, wherein the second semiconductor layer further includes a third semiconductor region, and the third semiconductor region is between the first partial region and the third electrode in the second direction.

Configuration 9

The semiconductor device according to Configuration 8, wherein the first insulating layer further includes a second insulating region, and the second insulating region is between the third semiconductor region and the third electrode in the second direction.

Configuration 10

The semiconductor device according to any one of Configurations 6 to 9, wherein the second electrode is electrically connected to the third semiconductor layer.

Configuration 11

The semiconductor device according to any one of Configurations 1 to 10, wherein the concentration of magnesium in the first semiconductor layer is less than $1\times10^{18}/cm^3$.

Configuration 12

The semiconductor device according to any one of Configurations 1 to 11, wherein the concentration of hydrogen in the first semiconductor layer is less than $1\times10^{17}/cm^3$.

Configuration 13 The semiconductor device according to any one of

Configurations 1 to 12, wherein the concentration of hydrogen in the first semiconductor layer is greater than $1\times10^{14}/cm^3$.

Configuration 14

The semiconductor device according to any one of Configurations 1 to 13, wherein a concentration of magnesium in the first semiconductor region is lower than the concentration of magnesium in the first semiconductor layer.

Configuration 15

The semiconductor device according to any one of Configurations 1 to 14, wherein a concentration of hydrogen in the first semiconductor region is lower than the concentration of magnesium in the first semiconductor region.

Configuration 16

The semiconductor device according to any one of Configurations 1 to 15, wherein a concentration of hydrogen in the first semiconductor region is lower than the concentration of hydrogen in the first semiconductor layer.

Configuration 17

The semiconductor device according to any one of Configurations 1 to 16, further comprising an intermediate region including silicon and nitrogen, the intermediate region being between the third electrode and the first semiconductor layer in the first direction.

Configuration 18

A semiconductor device, comprising:
a first electrode;
a second electrode;
a third electrode, a position of the third electrode in a first direction being between a position of the first electrode in the first direction and a position of the second electrode in the first direction, the first direction being from the first electrode toward the second electrode;
a first semiconductor layer including $Al_{x1}Ga_{1-x1}N$ ($0\leq x1<1$) and including a first partial region, a second partial region, a third partial region, a fourth partial region, and a fifth partial region, a second direction from the first partial region toward the first electrode crossing the first direction, a direction from the second partial region toward the second electrode being aligned with the second direction, a direction from the third partial region toward the third electrode being aligned with the second direction, the fourth partial region being between the first partial region and the third partial region in the first direction, the fifth partial region being between the third partial region and the second partial region in the first direction;

a second semiconductor layer including $Al_{x2}Ga_{1-x2}N$ ($0<x2\leq 1$ and $x1<x2$) and including a first semiconductor region and a second semiconductor region, a direction from the fourth partial region toward the first semiconductor region being aligned with the second direction, a direction from the fifth partial region toward the second semiconductor region being aligned with the second direction; and a first insulating layer including a first insulating region, the first insulating region being between the third partial region and the third electrode in the second direction, a concentration of hydrogen in the fourth partial region being less than $1/10$ of a concentration of magnesium in the fourth partial region.

Configuration 19

The semiconductor device according to Configuration 18, wherein the concentration of magnesium in the fourth partial region is less than $1\times 10^{18}/cm^3$.

Configuration 20

The semiconductor device according to Configuration 18 or 19, wherein the concentration of hydrogen in the fourth partial region is less than $1\times 10^{17}/cm^3$.

Configuration 21

The semiconductor device according to any one of Configurations 18 to 20, wherein the concentration of hydrogen in the fourth partial region is greater than $1\times 10^{15}/cm^3$.

Configuration 22

The semiconductor device according to any one of Configurations 18 to 21, wherein a concentration of magnesium in the first semiconductor region is lower than the concentration of magnesium in the fourth partial region.

Configuration 23

The semiconductor device according to any one of Configurations 18 to 22, wherein a concentration of hydrogen in the first semiconductor region is lower than the concentration of magnesium in the first semiconductor region.

Configuration 24

The semiconductor device according to any one of Configurations 18 to 23, wherein a concentration of hydrogen in the first semiconductor region is lower than the concentration of hydrogen in the fourth partial region.

Configuration 25

The semiconductor device according to any one of Configurations 18 to 24, further comprising an intermediate region provided between the fourth partial region and the first semiconductor region, the intermediate region including silicon and nitrogen.

Configuration 26

The semiconductor device according to Configuration 25, wherein a thickness along the second direction of the intermediate region is not less than 1 nm and not more than 5 nm.

According to the embodiments, a semiconductor device and a method for manufacturing the semiconductor device can be provided in which the characteristics can be improved.

In the specification, "nitride semiconductor" includes all compositions of semiconductors of the chemical formula $B_xIn_yAl_zGa_{1-x-y-z}N$ ($0\leq x\leq 1$, $0\leq y\leq 1$, $0\leq z\leq 1$, and $x+y+z\leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a third electrode, a position of the third electrode in a first direction being between a position of the first electrode in the first direction and a position of the second electrode in the first direction, the first direction being from the first electrode toward the second electrode;
   a first semiconductor layer including $Al_{x1}Ga_{1-x1}N$ ($0\leq x1<1$) and including a first partial region, a second partial region, and a third partial region, a second direction from the first partial region toward the first electrode crossing the first direction, a direction from the second partial region toward the second electrode being aligned with the second direction, a direction from the third partial region toward the third electrode being aligned with the second direction;
   a second semiconductor layer including $Al_{x2}Ga_{1-x2}N$ ($0<x2\leq 1$ and $x1<x2$), a portion of the second semiconductor layer being between the third partial region and the third electrode in the second direction; and a first insulating layer including a first insulating region, the first insulating region being between the third electrode and the portion of the second semiconductor layer in the second direction, a concentration of hydrogen in the first semiconductor layer being less than 1/10 of a concentration of magnesium in the first semiconductor layer.

2. The device according to claim 1, wherein the concentration of magnesium in the first semiconductor layer is less than $1 \times 10^{18}/cm^3$.

3. The device according to claim 1, wherein the concentration of hydrogen in the first semiconductor layer is less than $1 \times 10^{17}/cm^3$.

4. The device according to claim 1, wherein the concentration of hydrogen in the first semiconductor layer is greater than $1 \times 10^{14}/cm^3$.

5. The device according to claim 1, wherein a concentration of magnesium in the second semiconductor layer is lower than the concentration of magnesium in the first semiconductor layer.

6. The device according to claim 5, wherein a concentration of hydrogen in the second semiconductor layer is lower than the concentration of magnesium in the second semiconductor layer.

7. The device according to claim 1, wherein a concentration of hydrogen in the second semiconductor layer is lower than the concentration of hydrogen in the first semiconductor layer.

8. The device according to claim 1, further comprising an intermediate region provided between the first insulating region and the portion of the second semiconductor layer, the intermediate region including silicon and nitrogen.

9. The device according to claim 8, wherein a thickness along the second direction of the intermediate region is not less than 1 nm and not more than 5 nm.

* * * * *